(12) United States Patent
Oota et al.

(10) Patent No.: US 9,894,799 B2
(45) Date of Patent: Feb. 13, 2018

(54) ELECTRONIC DEVICE

(71) Applicant: FUJITSU LIMITED, Kawasaki-shi, Kanagawa (JP)

(72) Inventors: Jun Oota, Fukuoka (JP); Mitsuru Etou, Fukuoka (JP); Kazunori Omori, Kasuga (JP); Yasuhisa Kanemaru, Fukuoka (JP); Hiroyuki Shouyama, Fukuoka (JP); Koichi Namimatsu, Chikushino (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/187,216

(22) Filed: Jun. 20, 2016

(65) Prior Publication Data

US 2017/0013742 A1 Jan. 12, 2017

(30) Foreign Application Priority Data

Jul. 10, 2015 (JP) .................... 2015-138889

(51) Int. Cl.
*H05K 7/20* (2006.01)
*H01L 23/473* (2006.01)

(52) U.S. Cl.
CPC ..... *H05K 7/20145* (2013.01); *H05K 7/20563* (2013.01); *H05K 7/20572* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 6,888,069 B1* | 5/2005 | Chen | H05K 7/1421 174/50 |
| 2004/0166796 A1* | 8/2004 | Miyazaki | A47B 63/00 454/252 |
| 2006/0139877 A1* | 6/2006 | Germagian | H05K 7/20745 361/695 |
| 2008/0259563 A1* | 10/2008 | Fukuda | G06F 1/182 361/695 |

(Continued)

FOREIGN PATENT DOCUMENTS

JP 2005-286268 10/2005
WO WO 2009/004708 A1 1/2009

*Primary Examiner* — Anthony Haughton
*Assistant Examiner* — Razmeen Gafur
(74) *Attorney, Agent, or Firm* — Staas & Halsey LLP

(57) ABSTRACT

An electronic device includes a rack, a mount housing in which an electronic component is housed, and mounted in the rack from a front face side or rear face side of the rack, and a movable duct configured to have a housed state where the movable duct is retracted from an opening formed in a sidewall part of the mount housing and is housed in the mount housing and an opened state where the movable duct is moved to outside of the mount housing through the opening so as to form a ventilation flue located outside the mount housing and communicating with the opening.

19 Claims, 26 Drawing Sheets

(56) References Cited

U.S. PATENT DOCUMENTS

| | | | |
|---|---|---|---|
| 2009/0122484 A1* | 5/2009 | Caveney | H05K 7/20572 361/692 |
| 2010/0118489 A1 | 5/2010 | Izuhara et al. | |
| 2010/0238626 A1* | 9/2010 | Linhares, Jr. | H05K 7/20736 361/690 |
| 2011/0267767 A1* | 11/2011 | Sun | H05K 7/20736 361/679.46 |
| 2011/0267775 A1* | 11/2011 | VanDerVeen | H05K 7/20736 361/692 |
| 2012/0127656 A1* | 5/2012 | Driggers | G06F 1/183 361/679.47 |
| 2012/0281352 A1* | 11/2012 | Namek | H05K 7/20745 361/679.46 |
| 2012/0300391 A1* | 11/2012 | Keisling | H05K 7/20745 361/679.46 |
| 2013/0088833 A1* | 4/2013 | Cox | H05K 7/20736 361/689 |
| 2014/0016266 A1* | 1/2014 | Lenart | H05K 7/20145 361/690 |
| 2014/0043758 A1* | 2/2014 | Arflack | H05K 7/1489 361/690 |
| 2014/0063729 A1* | 3/2014 | Claassen | H05K 7/20736 361/679.46 |
| 2014/0168887 A1* | 6/2014 | Lai | H05K 7/20736 361/679.46 |
| 2014/0177164 A1* | 6/2014 | Stewart | H05K 7/20145 361/679.46 |
| 2014/0185237 A1* | 7/2014 | Hanson | H05K 5/0239 361/692 |
| 2014/0254089 A1* | 9/2014 | Eichelberg | H05K 7/20745 361/679.46 |
| 2014/0355201 A1* | 12/2014 | Alshinnawi | H05K 7/20736 361/679.47 |
| 2015/0189787 A1* | 7/2015 | Bailey | H05K 7/1489 361/679.48 |
| 2015/0334873 A1* | 11/2015 | Maeda | H05K 7/20181 361/690 |
| 2016/0066478 A1* | 3/2016 | Van Den Bergen | G03F 7/70991 361/679.47 |
| 2016/0135329 A1* | 5/2016 | Lewis, II | H05K 7/20745 361/692 |
| 2016/0165760 A1* | 6/2016 | Kutsuzawa | H05K 7/20736 361/679.5 |

* cited by examiner

ELECTRONIC DEVICE

CROSS-REFERENCE TO RELATED APPLICATION

This application is based upon and claims the benefit of priority of the prior Japanese Patent Application No. 2015-138889, filed on Jul. 10, 2015, the entire contents of which are incorporated herein by reference.

FIELD

The embodiments discussed herein are related to an electronic device.

BACKGROUND

There is an electronic device including a rack, a mount housing mounted in the rack, and a cooling fan for cooling the inside of the mount housing (see, for example, Japanese Laid-open Patent Publication No. 2005-286268 and International Publication Pamphlet No. WO2009/004708). The mount housing houses multiple plug-in units each equipped with multiple electronic components that generate heat, for example.

In this kind of electronic device, the cooling fan operates to generate cooling air passing through the mount housing in the front-rear direction. This cooling air is introduced into the plug-in units from inlets on the front side of the plug-in units, for example. The cooling air introduced into the plug-in units is discharged from outlets on the rear side of the plug-in units after passing over the multiple electronic components. The cooling air cools the electronic components in the respective plug-in units.

SUMMARY

According to an aspect of the invention, an electronic device includes: a rack; a mount housing in which an electronic component is housed, and mounted in the rack from a front face side or rear face side of the rack; and a movable duct configured to have a housed state where the movable duct is retracted from an opening formed in a sidewall part of the mount housing and is housed in the mount housing and an opened state where the movable duct is moved to outside of the mount housing through the opening so as to form a ventilation flue located outside the mount housing and communicating with the opening.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The densification of electronic components mounted in a plug-in unit may make it difficult to design the plug-in unit to have an inlet on the front face side of the plug-in unit and an outlet on the rear face side of the plug-in unit. In this case, cooling air may not flow smoothly inside a mount housing and may reduce cooling efficiency of the electronic components in the mount housing.

Hereinafter, description is given of embodiments of a technology that makes it possible to suppress reduction in cooling efficiency of the electronic components in the mount housing.

First Embodiment

[Electronic Device]

Figure 1:
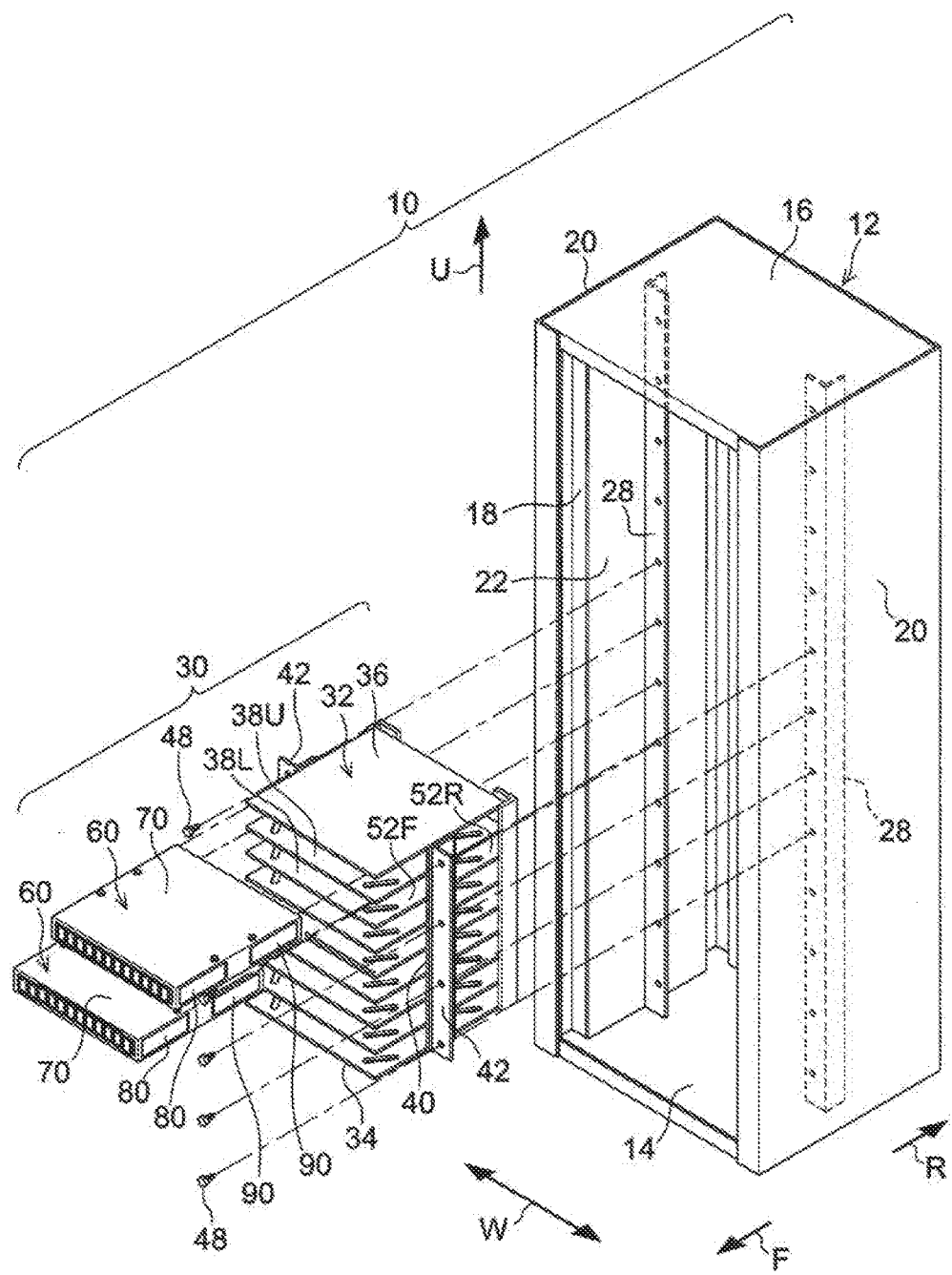
FIG. 1 is an exploded perspective view illustrating an electronic device according to a first embodiment.

As illustrated in FIG. 1, an electronic device 10 according to a first embodiment is an optical transmission device, for example. The electronic device 10 includes a rack 12, multiple rack mount units 30, and multiple cooling fans 58 (see FIG. 2). The rack mount units 30 each includes a mount housing 32 and multiple electronic units 60 housed in the mount housing 32.

Note that the arrow F illustrated as appropriate in the respective drawings indicates the front side of the rack 12 in the front-rear direction, and the arrow R indicates the rear side of the rack 12 in the front-rear direction. Moreover, the arrow W indicates the width direction of the rack 12. Furthermore, the arrow U indicates the upper side of the rack 12 in the height direction (vertical direction). Also, the front-rear direction, width direction, and height direction of the rack mount unit 30 (mount housing 32) and the electronic unit 60 (unit housing 70) correspond to the front-rear direction, width direction, and height direction of the rack 12.

[Rack]

Figure 2:
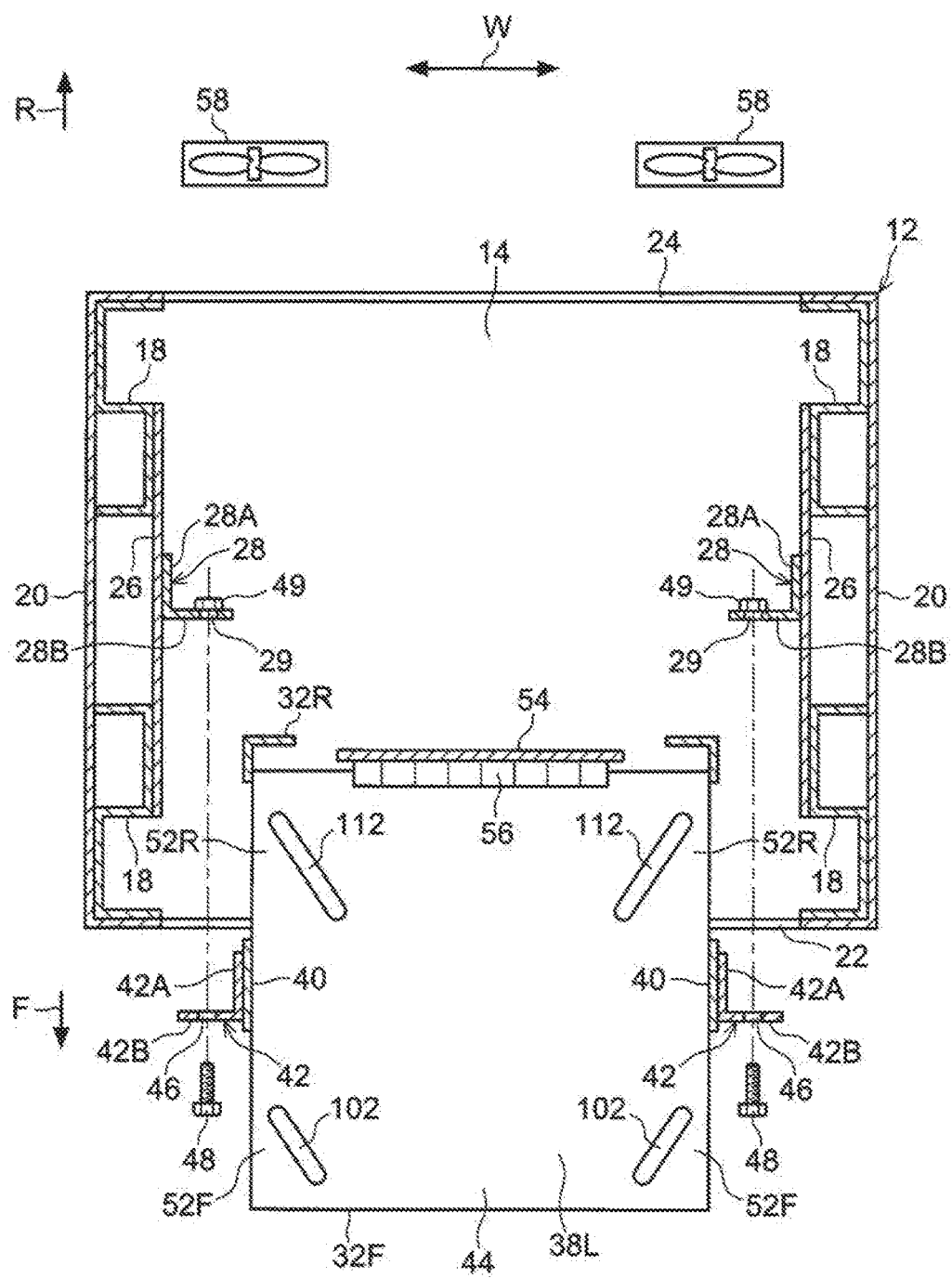
FIG. 2 is a top cross-sectional view illustrating a rack and a mount housing illustrated in FIG. 1.

As illustrated in FIGS. 1 and 2, the rack 12 is a general-purpose 19-inch rack, for example, and is formed into a rectangular parallelepiped shape with the height direction as the longitudinal direction. The rack 12 includes a base 14, a ceiling part 16, multiple posts 18, and a pair of sidewall parts 20.

On the front face (referring as 12F unillustrated) side of the rack 12, a mount opening 22 is formed for mounting the mount housing 32. This mount opening 22 also functions as an inlet for introducing outside air (cooling air) into the rack 12 when the cooling fans 58 to be described later are operated. Meanwhile, on the rear face (referring as 12R unillustrated) side of the rack 12, an outlet 24 (see FIG. 2) is formed to discharge the outside air (cooling air) introduced into the rack 12 by the cooling fans 58 to the outside.

Note that the mount opening may be formed on the rear 12R side of the rack 12. Alternatively, the mount opening may also be formed on both of the front face 12F side and rear face 12R side of the rack 12. In other words, the mount opening may be formed on at least one of the front face 12F side and the rear face 12R side of the rack 12.

The base 14 and the ceiling part 16 are formed into a rectangular shape in a planar view, and are disposed facing each other in the height direction of the rack 12. Between the base 14 and the ceiling part 16, the multiple (in this embodiment, four) posts 18 are provided. As illustrated in FIG. 2, each of the posts 18 are formed into an S-shape in the planar view and provided at each corner of the base 14.

The pair of sidewall parts 20 are disposed on the outside of the pair of front and rear posts 18 adjacent to each other in the front-rear direction of the rack 12. The pair of front and rear sidewall parts 20 are disposed facing each other in the width direction of the rack 12, and are supported on the pair of front and rear posts 18, respectively. Also, on the inside of the pair of front and rear posts 18, horizontal frames 26 extending in the front-rear direction of the rack 12 are disposed. The horizontal frames 26 are provided over the pair of front and rear posts 18. Mount frames 28 extending in the height direction of the rack 12 are attached to the horizontal frames 26.

A pair of the mount frames 28 are formed into an L-shape in the planar view. The pair of mount frames 28 are disposed in the middle of the rack 12 in the front-rear direction. Also, the pair of mount frames 28 are disposed on the both sides of the mount housing 32 in the width direction in a state where the mount housing 32 is mounted in the rack 12. Each of the mount frames 28 includes a base part 28A fixed to the horizontal frame 26 and a flange part 28B extending toward the center of the rack 12 in the width direction from the base part 28A. Note that the flange part 28B is an example of a fixed part.

In the flange part 28B, multiple bolt holes 29 are formed, which penetrate the flange part 28B in the front-rear direction of the rack 12. Also, bolts 48 for fixing flange parts 42B in the mount housing 32 to be described later to the flange parts 28B are inserted into predetermined bolt holes 29.

[Rack Mount Unit]

As illustrated in FIG. 1, the mount housing 32 in the rack mount unit 30 is a shelf or a sub-rack mounted in the rack 12, for example. The mount housing 32 is formed into a rectangular parallelepiped shape, and is mounted into the rack 12 from the mount opening 22. Multiple the mount housings 32 are housed in the rack 12 in the height direction of the rack 12. Each of the mount housings 32 includes a bottom wall part 34, a ceiling part 36, multiple dividers 38, a pair of sidewall parts 40, and a pair of mount brackets 42.

The inside of the mount housing 32 is divided in the height direction of the mount housing 32 by the multiple dividers 38. Thus, housing spaces for housing the electronic units 60 are formed between the dividers 38 adjacent to each other in the height direction. Note that, hereinafter, for differentiation, the divider 38 disposed above the electronic unit 60 may be described as an upper-side divider 38U, and the divider 38 disposed below the electronic unit 60 may be described as a lower-side divider 38L.

As illustrated in FIG. 2, a housing opening 44 for housing the electronic unit 60 is formed on the front face 32F side of the mount housing 32, in other words, between front ends of the upper-side divider 38U and lower-side divider 38L. Note that the housing opening may be formed on the rear face 32R side of the mount housing 32. Alternatively, the housing opening may also be formed on both of the front face 32F side and rear face 32R side of the mount housing 32. In other words, the housing opening may be formed on at least one of the front face 32F side and the rear face 32R side of the mount housing 32.

The pair of sidewall parts 40 in the mount housing 32 are disposed facing each other in the width direction of the mount housing 32. On the outer surfaces in the middle part of the mount housing 32 in the front-rear direction on the pair of sidewall parts 40, the mount brackets 42 are provided, respectively. Note that the middle part of the mount housing 32 in the front-rear direction on the sidewall parts 40 mean a part other than the both ends of the mount housing 32 in the front-rear direction on the sidewall parts 40.

The mount brackets 42 are formed into an L-shape in the planar view. Each of the mount brackets 42 includes a base part 42A fixed to the sidewall part 40 and a flange part 42B extending outward in the width direction of the rack 12 from the base part 42A. Note that the flange part 42B is an example of a fixing part.

Figure 3:
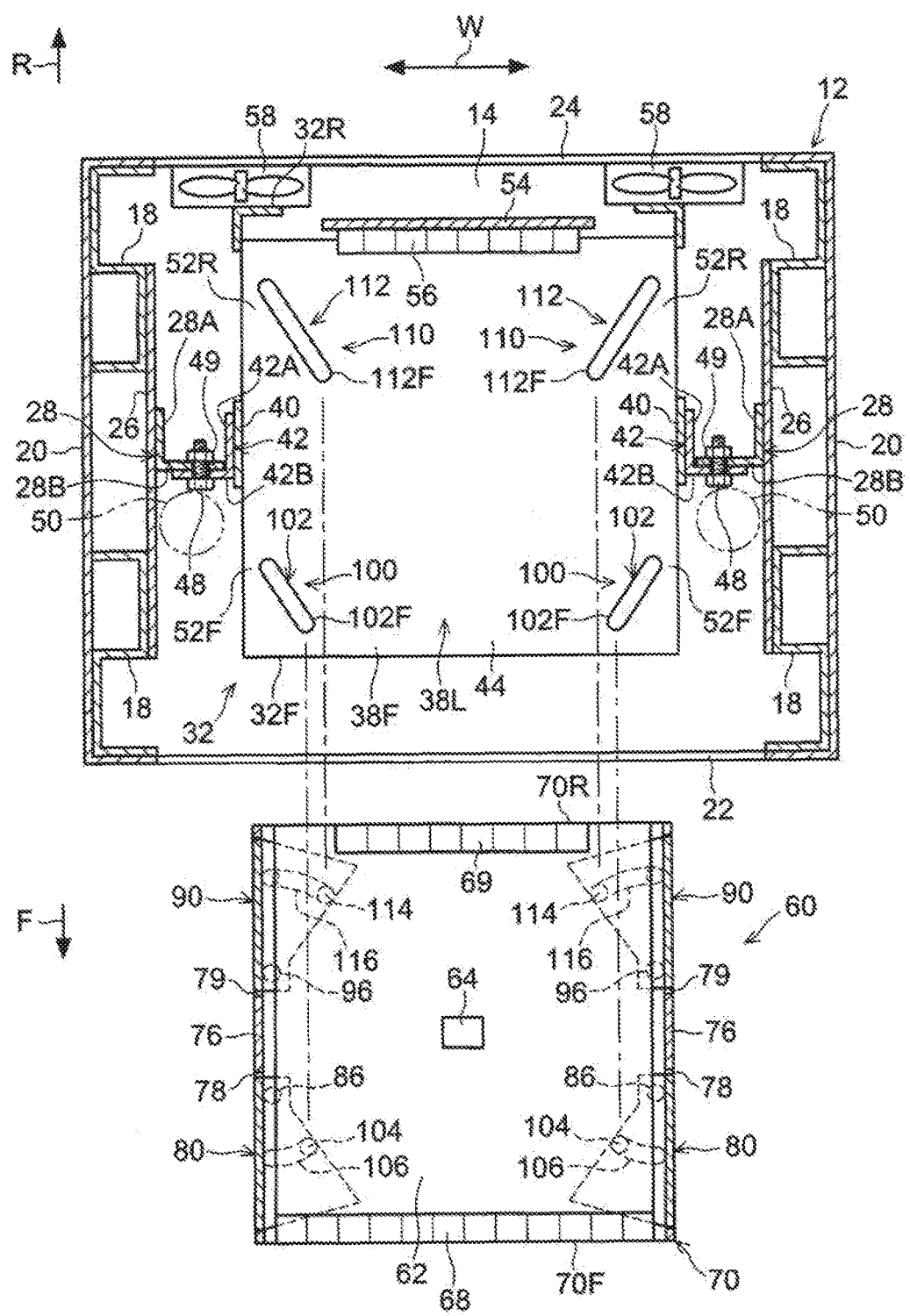
FIG. 3 is a top cross-sectional view illustrating the rack, the mount housing, and an electronic unit illustrated in FIG. 1.

In the flange part 42B, multiple bolt holes 46 are formed, which penetrate the flange part 42B in the front-rear direction of the rack 12. The flange part 42B is placed on the flange part 28B of the mount frame 28 in the front-rear direction of the rack 12, and fixed to the flange part 28B with the bolt 48 and a nut 49 in a state where the mount housing 32 is mounted in the rack 12, as illustrated in FIG. 3.

Note that, in the state where the mount housing 32 is mounted in the rack 12, a region on the front side (arrow F side) of the flange part 42B of the mount bracket 42 serves as a wiring space 50 for installing an unillustrated cable and the like.

On the front side of the pair of sidewall parts 40, front-side openings 52F are formed, respectively, for opening intake movable ducts 80 to be described later. The respective front-side openings 52F are provided closer to the front side than the flange parts 42B of the mount brackets 42. On the other hand, on the rear side of the pair of sidewall parts 40, rear-side openings 52R are formed, respectively, for opening exhaust movable ducts 90 to be described later. The respective rear-side openings 52R are provided behind the flange parts 42B of the mount brackets 42. Note that the front-side openings 52F and the rear-side openings 52R are an example of openings.

A backboard 54 is housed behind the mount housing 32. The backboard 54 is disposed, with the front-rear direction of the mount housing 32 as a thickness direction, behind the multiple dividers 38. Multiple first connectors 56, to which the multiple electronic units 60 are connected, respectively, are mounted in the backboard 54. The multiple first connectors 56 are arranged with a space in the height direction of the mount housing 32, and are arranged between the dividers 38 adjacent to each other in the height direction of the mount housing 32.

[Cooling Fan]

Figure 4:
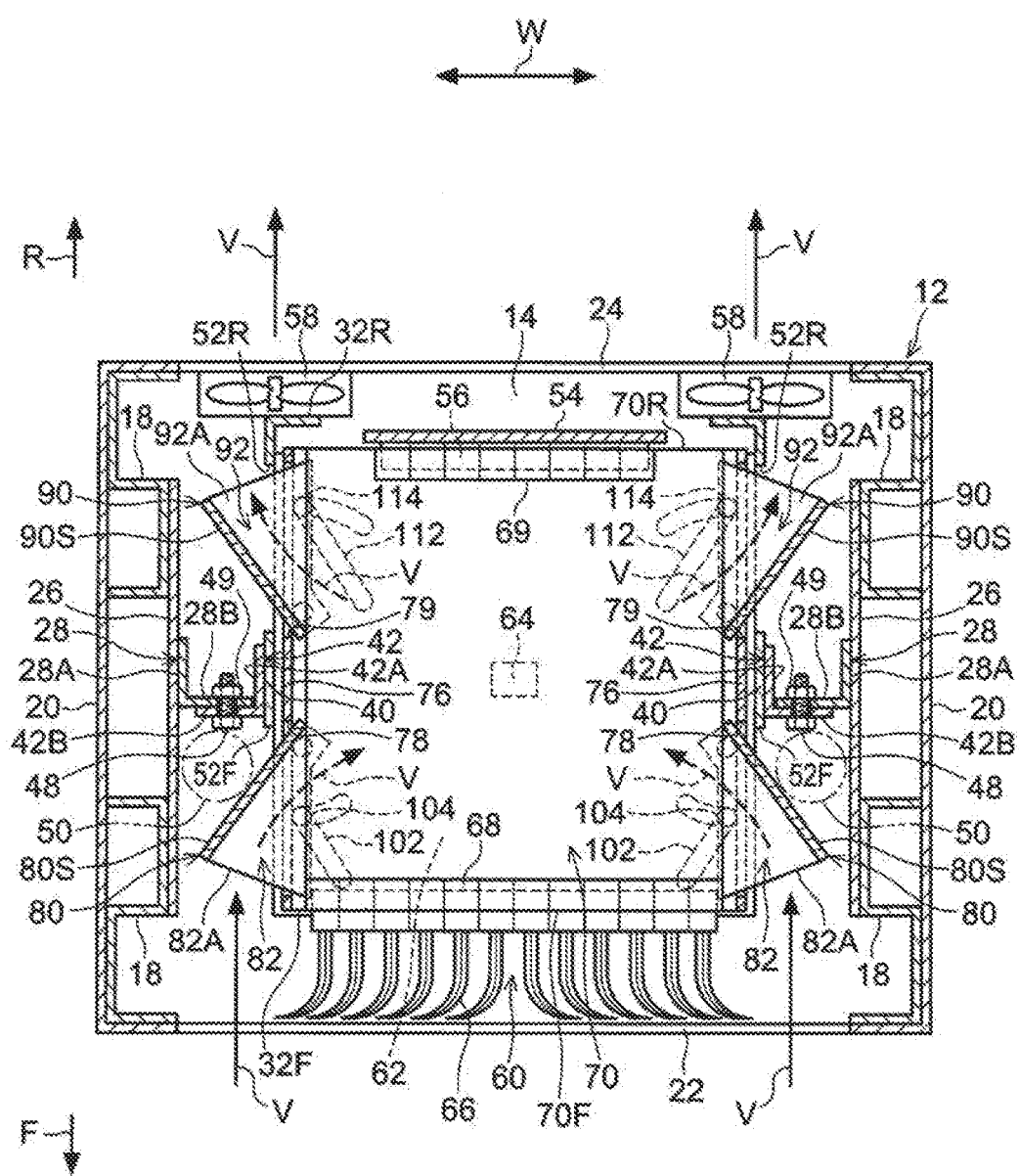
FIG. 4 is a top cross-sectional view illustrating a state where the mount housing and the electronic unit are mounted in the rack illustrated in FIG. 1.

As illustrated in FIG. 4, the multiple cooling fans 58 are provided behind the mount housing 32. The multiple cooling fans 58 are axial flow fans, for example, and are disposed with the front-rear direction of the mount housing 32 as an axial direction. Moreover, at least some of the multiple cooling fans 58 are disposed on the outside of the backboard 54 in the width direction (arrow W direction) of the rack 12.

Here, when the multiple cooling fans 58 are operated, air inside the rack 12 is discharged to the outside of the rack 12 from the outlet 24 in the rear face 12R of the rack 12, and the outside air is introduced into the rack 12 from the mount opening (inlet) 22 in the front face 12F of the rack 12. More specifically, when the multiple cooling fans 58 are operated, cooling air V is generated, which passes through the rack 12 in the front-rear direction. Moreover, the respective cooling fans 58 are disposed facing outlets 92A of the exhaust movable ducts 90 in the opened state to be described later in the front-rear direction of the mount housing 32.

[Electronic Unit]

As illustrated in FIG. 4, the electronic unit 60 is a plug-in unit detachably housed in the mount housing 32, for example. The electronic unit 60 includes a printed circuit board 62, a unit housing 70, a pair of intake movable ducts 80, and a pair of exhaust movable ducts 90. The printed circuit board 62 is formed into a rectangular shape in the planar view, and is disposed with the height direction of the mount housing 32 as the thickness direction. Multiple electronic components 64 such as a central processing unit (CPU) and a memory are mounted on the printed circuit board 62.

On the front-end side of the printed circuit board 62, multiple cable connectors 68 for connecting cables 66 are mounted. The multiple cable connectors 68 are arranged along the front end of the printed circuit board 62. On the other hand, second connectors 69 are provided on the rear-end side of the printed circuit board 62. The second connectors 69 are connected to the first connector 56 in the backboard 54 in the front-rear direction of the mount housing 32.

Figure 5:
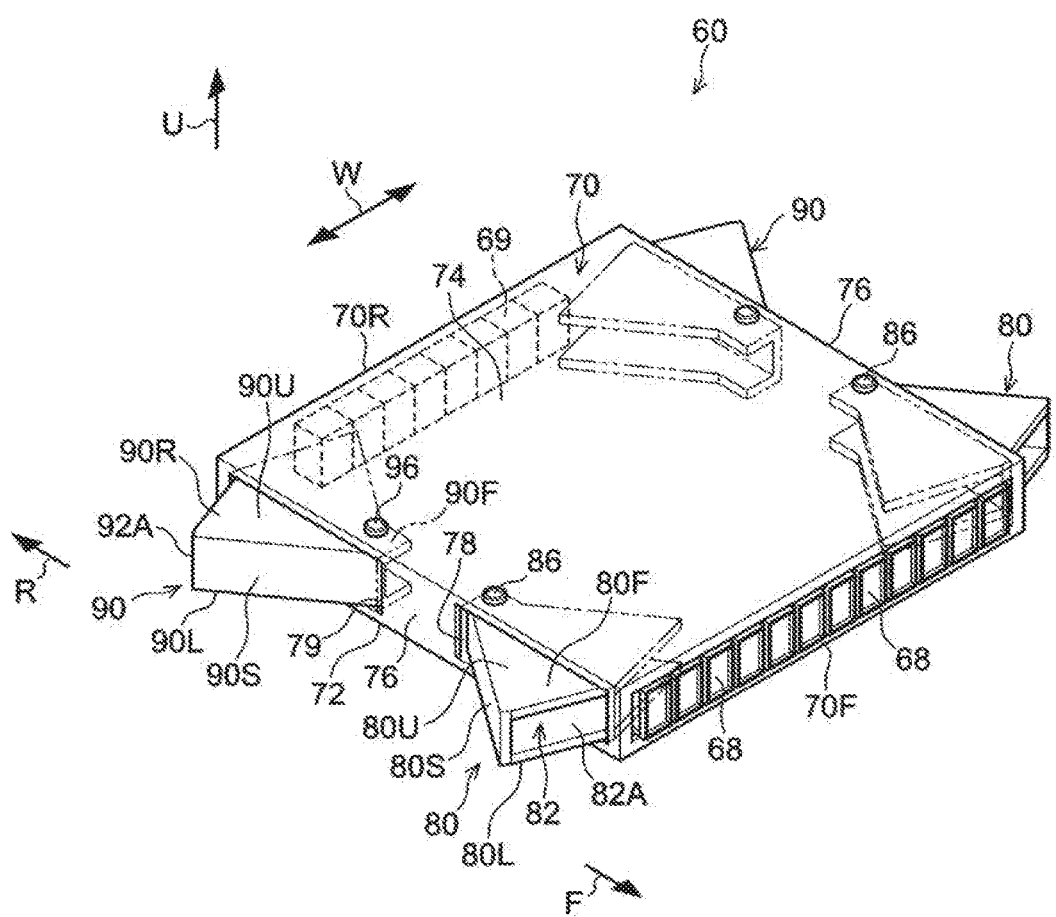
FIG. 5 is a perspective view illustrating the electronic unit illustrated in FIG. 1.

As illustrated in FIG. 5, the unit housing 70 is formed into a box shape. The unit housing 70 includes a bottom wall part 72, a ceiling part 74, and a pair of sidewall parts 76. Note that the multiple cable connectors 68 are exposed from a front face 70F of the unit housing 70. Meanwhile, the second connectors 69 are exposed from a rear face 70R of the unit housing 70.

Note that the unit housing 70 is provided with unillustrated connection levers (card levers) or the like for connecting the second connectors 69 to the first connectors 56 using the principle of leverage, for example. The cable connectors 68 and the second connectors 69 are an example of electronic components. Note that connection levers 130 illustrated in FIG. 19, for example, are used as the connection levers.

[Intake Movable Duct]

As illustrated in FIG. 5, the pair of intake movable ducts 80 are made of metal, for example, and provided on both sides in the width direction on the front side of the unit housing 70. Moreover, the pair of intake movable ducts 80 are disposed on the front side (one side) in the front-rear direction on the sidewall parts 76 on both sides of the unit housing 70. The pair of intake movable ducts 80 have the same configuration and are disposed symmetrically with respect to the center of the unit housing 70 in the width direction. Note that the pair of intake movable ducts 80 are an example of movable ducts. Moreover, the material of the intake movable ducts 80 is not limited to metal but may be resin, for example.

Figure 6:
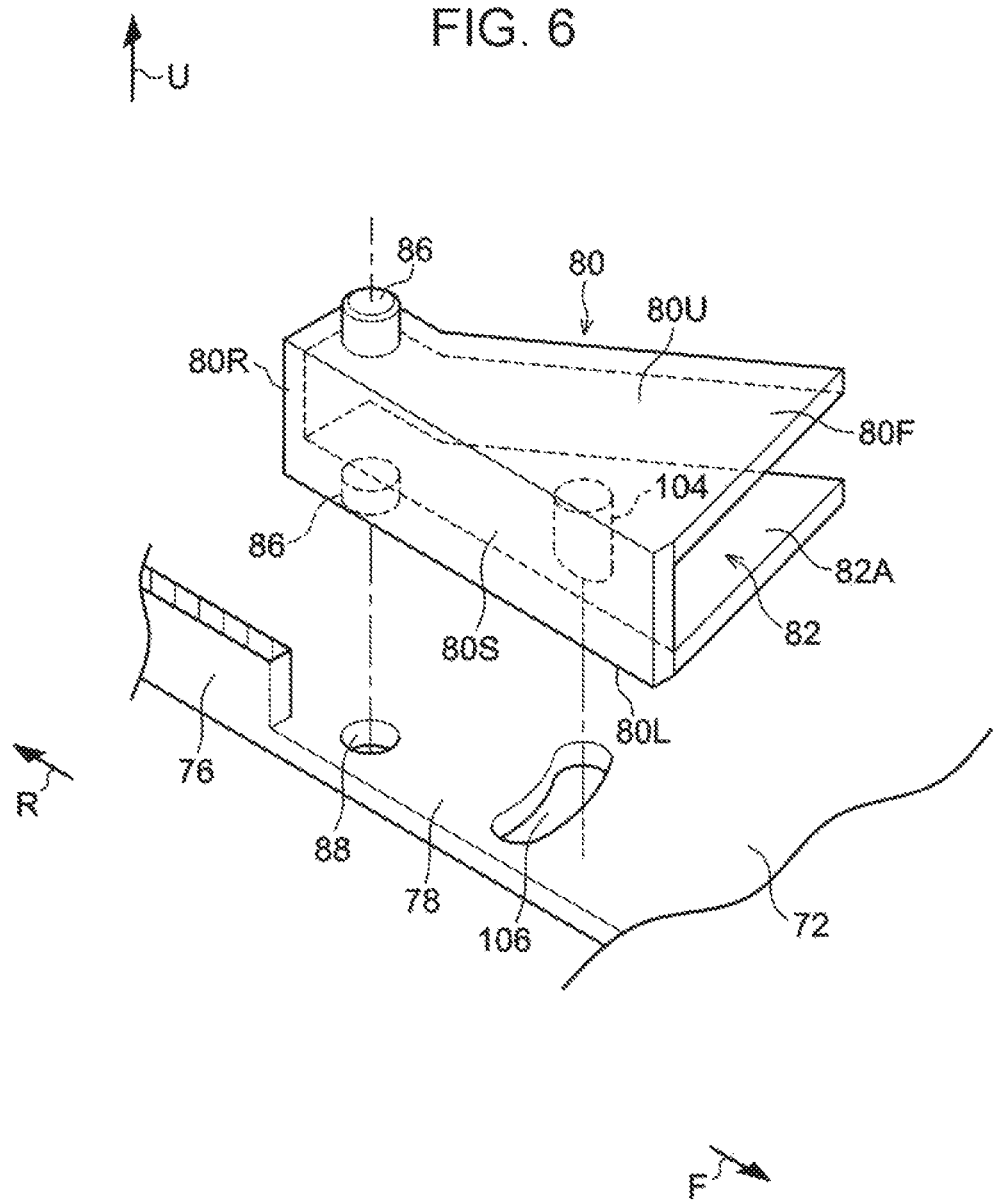
FIG. 6 is an exploded perspective view illustrating a unit housing and a intake movable duct illustrated in FIG. 5.

As illustrated in FIG. 6, the intake movable duct 80 is made of metal, for example, and formed into a triangular shape in the planar view. The cross-sectional shape of the intake movable duct 80 as seen from the front-rear direction of the unit housing 70 is a U-shape having an opening on the unit housing 70 side. Moreover, the intake movable duct 80 includes a lower wall part 80L, an upper wall part 80U, and a vertical wall part 80S. A ventilation flue 82 is formed inside the intake movable duct 80. Furthermore, an inlet 82A of the ventilation flue 82 is formed in a front-side end 80F of the intake movable duct 80. Note that the front-side end 80F of the intake movable duct 80 is an example of the one side end in the front-rear direction of the intake movable duct 80. Moreover, the inlet 82A is an example of the inlet/outlet of the ventilation flue.

As illustrated in FIG. 6, a pair of rotary shafts 86 extending in the height direction of the unit housing 70 are provided on a rear-side end 80R of the intake movable duct 80. Note that the rear-side end 80R of the intake movable duct 80 is an example of the other side end in the front-rear direction of the intake movable duct 80. The pair of rotary shafts 86 are coaxially arranged. The intake movable duct 80 is rotatably connected to the unit housing 70 through the pair of rotary shafts 86.

To be more specific, one of the pair of rotary shafts 86 protrudes upward from the upper wall part 80U, and is rotatably inserted into an unillustrated shaft hole formed in the ceiling part 74 (see FIG. 5) of the unit housing 70. On the other hand, the other one of the pair of rotary shafts 86 protrudes downward from the lower wall part 80L, and is rotatably inserted into a shaft hole 88 formed in the bottom wall part 72 of the unit housing 70.

Figure 7:
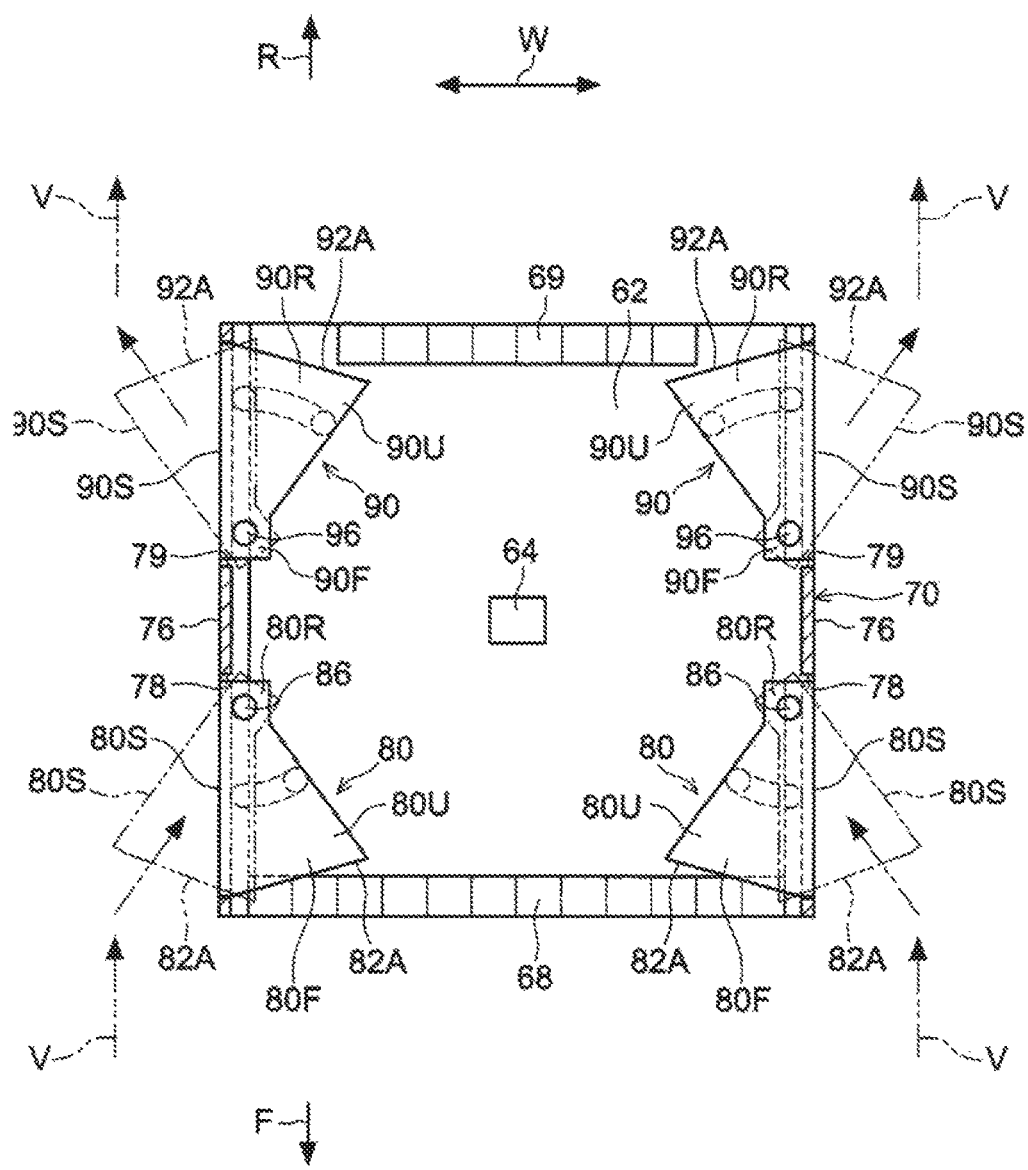
FIG. 7 is a top cross-sectional view illustrating the electronic unit illustrated in FIG. 5.

As illustrated in FIG. 7, the intake movable ducts 80 are housed in the front side part of the unit housing 70. Vent holes 78 are formed on the front side of the sidewall parts 76 of the unit housing 70. The vent holes 78 are formed in a rectangular shape with the front-rear direction of the unit housing 70 as the longitudinal direction. With the rotation about the pair of rotary shafts 86, the intake movable ducts 80 are switched between a housed state (state indicated by the solid lines) where the intake movable ducts are housed in the unit housing 70 from the vent holes 78 and an opened state (state indicated by the chain double-dashed lines) where the intake movable ducts protrude to the outside of the unit housing 70 from the vent holes 78.

In the housed state, the entire intake movable ducts 80 are disposed inside the unit housing 70, and the intake movable ducts 80 do not protrude to the outside of the unit housing 70 from the vent holes 78. Moreover, in the housed state, the vertical wall part 80S of each of the intake movable ducts 80 is disposed inside the vent hole 78, and a part of the vent hole 78 is blocked by the vertical wall part 80S. Note that, in the housed state, the end of the printed circuit board 62 in the width direction is disposed inside the ventilation flue 82 of the intake movable duct 80.

In the opened state, on the other hand, the intake movable ducts 80 protrude to the outside of the sidewall parts 76 of the unit housing 70 from the vent holes 78. Moreover, in the opened state, the inlets 82A of the intake movable ducts 80 are disposed on the outside of the sidewall parts 76 of the unit housing 70. Thus, the ventilation flue 82 (see FIG. 4) communicating with the vent hole 78 is formed (appears) outside the unit housing 70. The cooling air is introduced into the unit housing 70 from the ventilation flue 82.

Moreover, in the opened state, the inlet 82A of the ventilation flue 82 faces the front side (arrow F side). This makes it easier for the cooling air V to be introduced into the ventilation flue 82 from the inlet 82A. Furthermore, in the opened state, the vertical wall part 80S of each of the intake movable ducts 80 is tilted from the sidewall part 76 of the unit housing 70 such that the vertical wall part 80S extends outward from the unit housing 70 while extending toward the front. Thus, the vertical wall part 80S functions as an air guide plate for guiding the cooling air V introduced into the ventilation flue 82 to the vent hole 78.

[Exhaust Movable Duct]

As illustrated in FIG. 4, the pair of exhaust movable ducts 90 are made of metal, for example, and provided on both sides in the width direction on the rear side of the unit housing 70. Moreover, the pair of exhaust movable ducts 90 are disposed on the rear side (the other side) in the front-rear direction on the sidewall parts 76 on both sides of the unit housing 70. The pair of exhaust movable ducts 90 have the same configuration as the intake movable ducts 80, and are disposed symmetrically with respect to the center of the unit housing 70 in the width direction. Note that the pair of exhaust movable ducts 90 are an example of movable ducts. Moreover, the material of the exhaust movable ducts 90 is not limited to metal but may be resin, for example.

Moreover, in this embodiment, as an example, the basic configuration of the exhaust movable ducts 90 is the same as that of the intake movable ducts 80. Moreover, in the state where the electronic unit 60 is housed in the mount housing 32, the intake movable ducts 80 and the exhaust movable ducts 90 are disposed on both sides in the front-rear direction of the mount housing 32 across the flange parts 42B of the mount brackets 42, and are arranged to face in opposite directions to each other. Note that the exhaust movable ducts 90 and the intake movable ducts 80 may have different configurations.

As illustrated in FIG. 5 the exhaust movable duct 90 includes a lower wall part 90L, an upper wall part 90U, and a vertical wall part 90S. A ventilation flue 92 (see FIG. 4) is formed inside the exhaust movable duct 90. Furthermore, an outlet 92A of the ventilation flue 92 is formed in a rear-side end 90R of the exhaust movable duct 90. Note that the rear-side end 90R of the exhaust movable duct 90 is an example of the one side end in the front-rear direction of the exhaust movable duct 90. Moreover, the outlet 92A is an example of the inlet/outlet of the ventilation flue.

As illustrated in FIG. 7, a pair of rotary shafts 96 extending in the height direction of the unit housing 70 are provided on a front-side end 90F of the exhaust movable duct 90. The exhaust movable duct 90 is rotatably connected to the unit housing 70 through the pair of rotary shafts 96. Note that the front-side end 90F of the exhaust movable duct 90 is an example of the other side end in the front-rear direction of the exhaust movable duct 90.

The exhaust movable ducts 90 are housed in the rear side part of the unit housing 70. Vent holes 79 are formed on the rear side of the sidewall parts 76 of the unit housing 70. The vent holes 79 are formed in a rectangular shape with the front-rear direction of the unit housing 70 as the longitudinal direction. With the rotation about the pair of rotary shafts 96, the exhaust movable ducts 90 are switched between a housed state (state indicated by the solid lines) where the exhaust movable ducts are housed in the unit housing 70 from the vent holes 79 and an opened state (state indicated by the chain double-dashed lines) where the exhaust movable ducts protrude to the outside of the unit housing 70 from the vent holes 79.

In the housed state, the entire exhaust movable ducts 90 are disposed inside the unit housing 70, and the exhaust movable ducts 90 do not protrude to the outside of the unit housing 70 from the vent holes 79. Moreover, in the housed state, the vertical wall part 90S of each of the exhaust movable ducts 90 is disposed inside the vent hole 79, and a part of the vent hole 79 is blocked by the vertical wall part 90S. Note that, in the housed state, the end of the printed circuit board 62 in the width direction is disposed inside the ventilation flue 92 of the exhaust movable duct 90.

In the opened state, on the other hand, the exhaust movable ducts 90 protrude to the outside of the sidewall parts 76 of the unit housing 70 from the vent holes 79. Moreover, in the opened state, the outlets 92A of the exhaust movable ducts 90 are disposed on the outside of the sidewall parts 76 of the unit housing 70. Thus, the ventilation flue 92 communicating with the vent hole 79 is formed (appears) outside the unit housing 70.

Moreover, as illustrated in FIG. 4, in the opened state, the outlets 92A of the ventilation flues 92 are disposed on the outside of the backboard 54 in the width direction. Furthermore, the outlets 92A of the exhaust movable ducts 90 in the opened state face the rear side. Moreover, the cooling fans 58 are disposed behind the outlets 92A of the exhaust movable ducts 90 in the opened state, the cooling fans facing the outlets 92A in the front-rear direction of the mount housing 32. Thus, when the cooling fans 58 are operated, a negative pressure is generated in the ventilation flue 92, and the air (cooling air V) inside the unit housing 70 is discharged to the outside of the unit housing 70 through the ventilation flue 92.

Furthermore, in the opened state, the vertical wall part 90S of each of the exhaust movable ducts 90 is tilted from the sidewall part 76 of the unit housing 70 such that the vertical wall part 90S extends outward from the unit housing 70 while extending from the front to the rear. Thus, the vertical wall part 90S functions as an air guide plate for guiding the air (cooling air V) in the unit housing 70 to the outlet 24 of the rack 12.

[Opening Mechanism]

As illustrated in FIG. 3, the rack mount unit 30 is provided with opening mechanisms 100 and 110 configured to switch the intake movable ducts 80 and the exhaust movable ducts 90 from the housed state to the opened state, when the electronic unit 60 is housed into the mount housing 32.

The opening mechanism 100 for each of the intake movable ducts 80 includes a front-side guide hole 102 provided in the mount housing 32 and a guide pin 104 provided in the intake movable duct 80. Likewise, the opening mechanism 110 for each of the exhaust movable ducts 90 includes a rear-side guide hole 112 provided in the mount housing 32 and a guide pin 114 provided in the exhaust movable duct 90. Note that the front-side guide holes 102 and 112 are an example of a guide part. Also, the guide pins 104 and 114 are an example of a slide part.

Here, in this embodiment, the opening mechanism 100 for the intake movable duct 80 and the opening mechanism 110 for the exhaust movable duct 90 have the same basic configuration. Thus, the opening mechanism 100 for the intake movable duct 80 is mainly described below. As for the opening mechanism 110 for the exhaust movable duct 90, differences from the opening mechanism 100 are mainly described.

The front-side guide holes 102 are formed on both sides in the width direction on the housing opening 44 side of the lower-side divider 38L. Each of the front-side guide holes 102 is tilted from the housing direction (arrow R direction) of the unit housing 70 such that the front-side guide hole 102 extends outward in the width direction of the mount housing 32 while extending from a housing opening 44 side (front side) of the mount housing 32 to a back-end side thereof (rear side) being opposite from the housing opening 44 side. Note that the housing direction of the unit housing 70 is equal to the front-rear direction of the mount housing 32.

Figure 8:
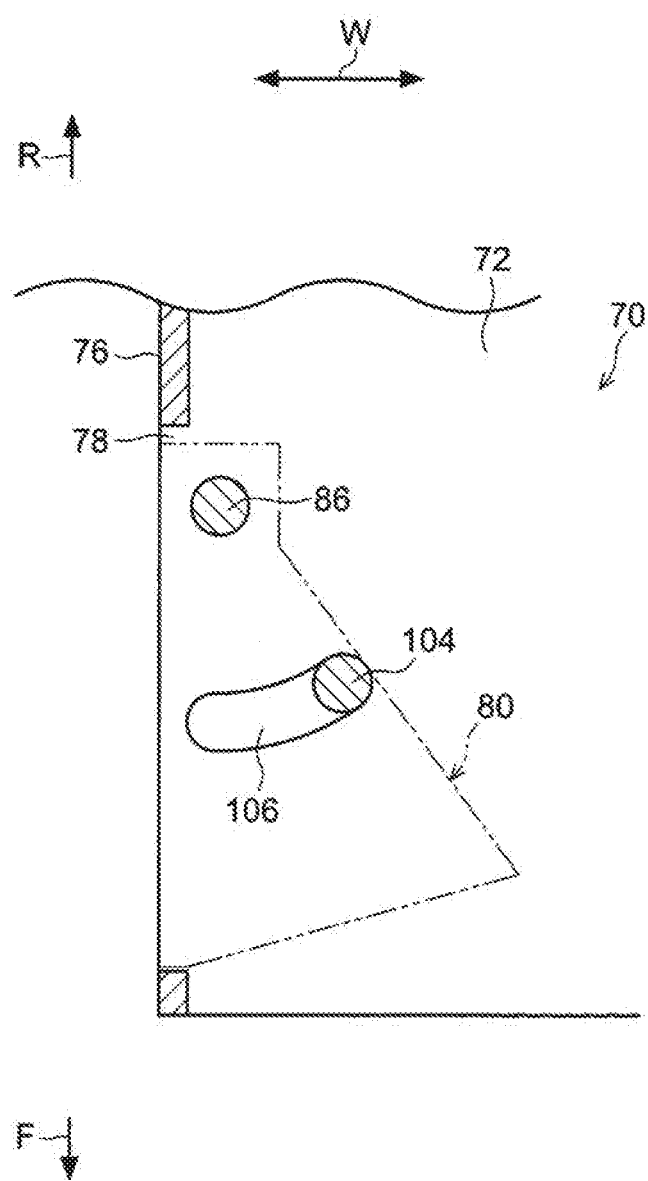
FIG. 8 is a partially enlarged view of FIG. 7.
Figure 9:
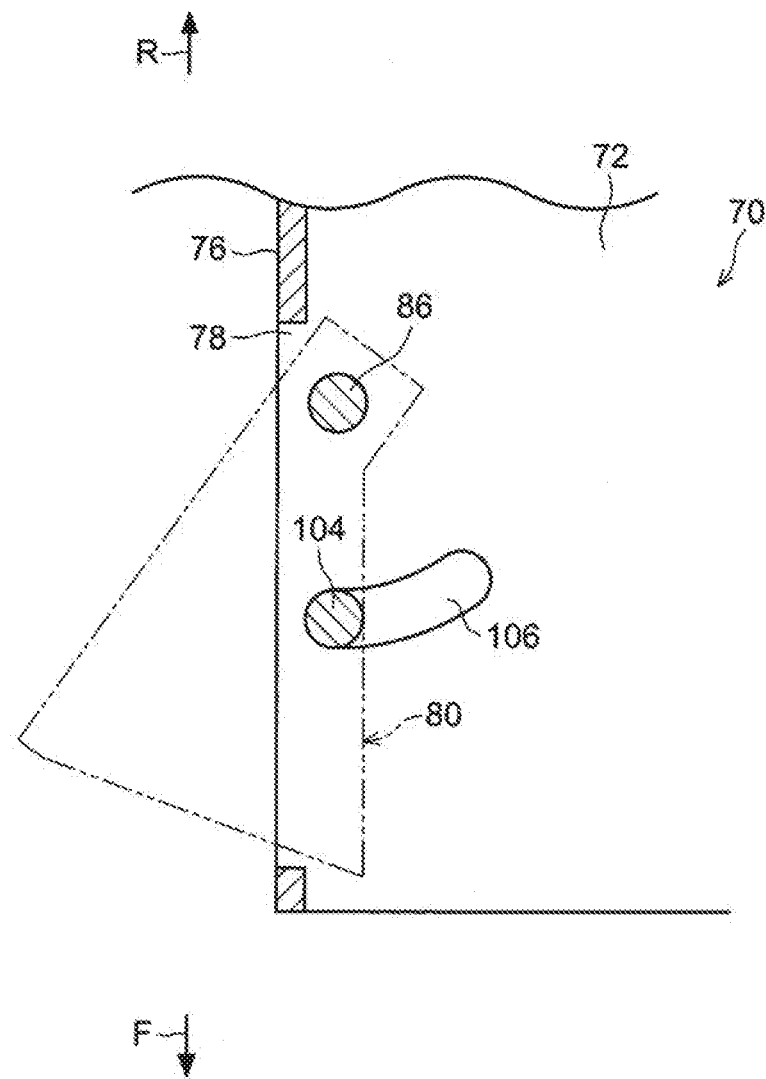
FIG. 9 is a partially enlarged view of FIG. 7.

As illustrated in FIG. 6, the guide pin 104 protrudes downward from the lower wall part 80L of the intake movable duct 80, and penetrates through an arc-shaped long hole 106 formed in the bottom wall part 72 of the unit housing 70. The long hole 106 is formed into an arc shape along the circumference of a circle centered at the pair of rotary shafts 86. Thus, as illustrated in FIGS. 8 and 9, the guide pin 104 is moved along the long hole 106 by the rotation of the intake movable duct 80 about the pair of rotary shaft 86.

Figure 10:
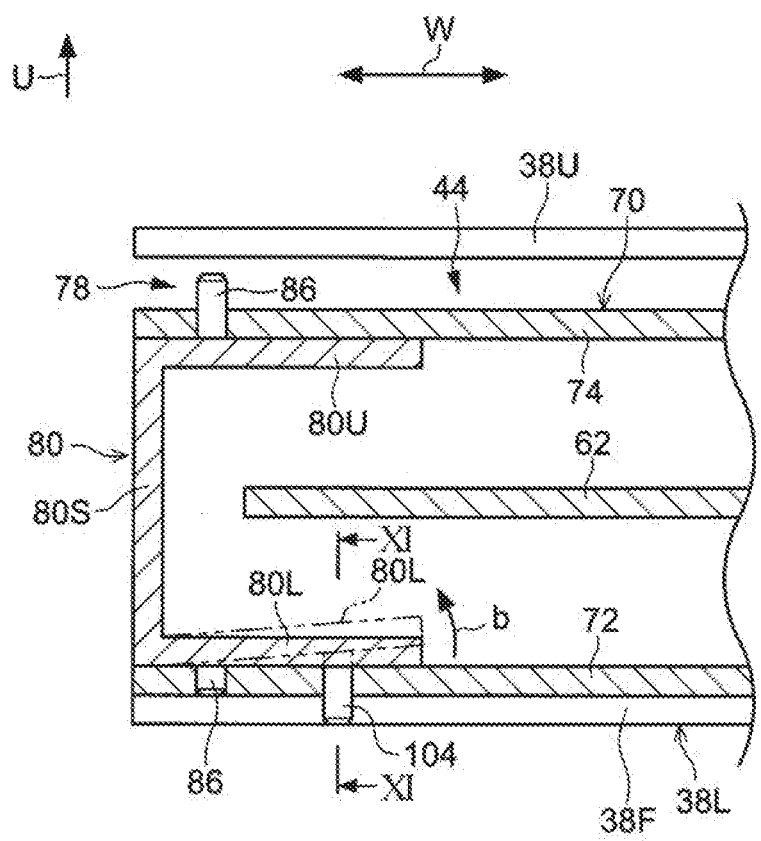
FIG. 10 is a longitudinal sectional view illustrating the mount housing and the electronic unit illustrated in FIG. 4.
Figure 11A:
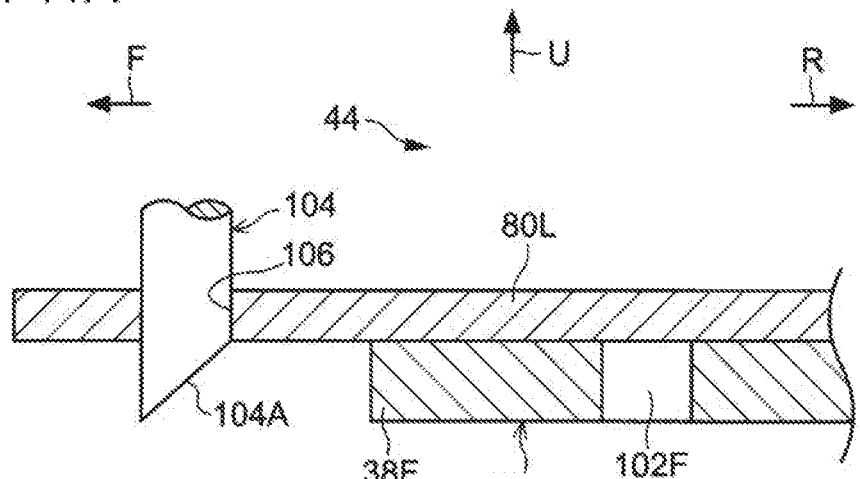
FIG. 11A is a cross-sectional view corresponding to the cross-section taken along the line XI-XI of FIG. 10.

Moreover, as illustrated in FIG. 10, the guide pin 104 protrudes downward from the bottom wall part 72 of the unit housing 70 through the long hole 106. As illustrated in FIG. 11A, on the tip (lower end) of the guide pin 104, a tilted surface 104A is formed, which comes into contact with the end 38F on the housing opening 44 side of the lower-side divider 38L. The tilted surface 104A is tilted from the housing direction of the electronic unit 60 such that the tilted surface 104A extends upward (to an upper-side divider 38U side, arrow U side) while extending from the front-end side (front side, arrow F side) to the back-end side (rear side, arrow R side) in the housing direction of the electronic unit 60.

Figure 11B:
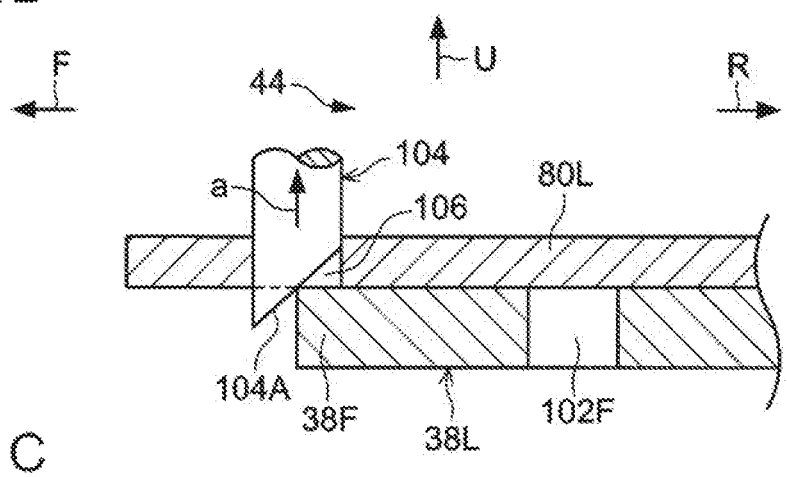
FIG. 11B is a cross-sectional view corresponding to the cross-section taken along the line XI-XI of FIG. 10.
Figure 11C:
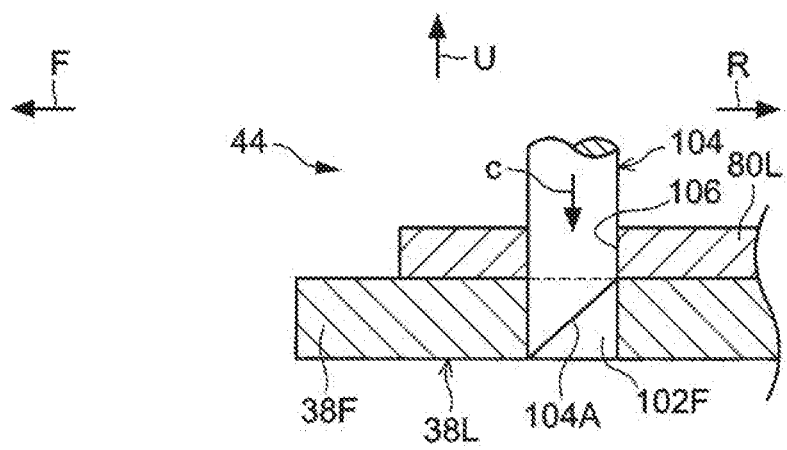
FIG. 11C is a cross-sectional view corresponding to the cross-section taken along the line XI-XI of FIG. 10.

As illustrated in FIG. 11B, when the tilted surface 104A comes into contact with the end 38F of the lower-side divider 38L, the guide pin 104 is moved upward (arrow a) along the tilted surface 104A, and the guide pin 104 runs on the end 38F of the lower-side divider 38L. In this event, as indicated by the chain double-dashed lines in FIG. 10, the lower wall part 80L of the intake movable duct 80 is elastically deformed upward (arrow b) relative to the vertical wall part 80S. In this state, as illustrated in FIG. 11C, when the guide pin 104 reaches the end 102F on the housing opening 44 side of the front-side guide hole 102, the lower wall part 80L of the intake movable duct 80 is restored from the elastic deformation and moved downward, and then the guide pin 104 is inserted into the end 102F of the front-side guide hole 102 (arrow c).

Moreover, as illustrated in FIGS. 12A, 12B, 13A, and 13B, the guide pin 104 slides along the front-side guide hole 102 when the electronic unit 60 is housed into the mount housing 32. Thus, the intake movable duct 80 is rotated about the pair of rotary shafts 86, and is changed from the housed state to the opened state.

Next, the opening mechanism 110 for the exhaust movable duct 90 is described. As illustrated in FIG. 3, the rear-side guide holes 112 are formed on both sides in the width direction on the back-end side of the lower-side divider 38L. The end 112 F on the housing opening 44 side of each of the rear-side guide holes 112 is disposed closer to the center side in the width direction of the mount housing 32 than the end 102F of the front-side guide hole 102.

The guide pin 114 of the opening mechanism 110 protrudes downward through an arc-shaped long hole 116 formed in the bottom wall part 72 of the unit housing 70 from the lower wall part 90L of the exhaust movable duct 90. The guide pin 114 is provided on the lower wall part 90L of the exhaust movable duct 90 so as to pass through the center side in the width direction of the mount housing 32 with respect to the front-side guide hole 102, such that the guide pin is not inserted into the front-side guide hole 102, when the electronic unit 60 is housed into the mount housing 32. Then, when the electronic unit 60 is housed into the mount housing 32, the guide pin 114 reaches the end 112F of the rear-side guide hole 112, and at that time, the guide pin 114 is inserted into the end 112F of the rear-side guide hole 112.

Moreover, as illustrated in FIGS. 14A, 14B, 15A, and 15B, the guide pin 114 slides along the rear-side guide hole 112 when the electronic unit 60 is housed into the mount housing 32. Thus, the exhaust movable duct 90 is rotated about the pair of rotary shafts 96, and is changed from the housed state to the opened state.

Note that the front-side guide holes 102 and the rear-side guide holes 112 as the guide part may be formed in at least one of the upper-side divider 38U and the lower-side divider 38L. Moreover, when the front-side guide holes 102 and the rear-side guide holes 112 are formed in the upper-side divider 38U, for example, the guide pins 104 and 114 protrude upward from the upper wall part 80U of the intake movable duct 80 and the ceiling part 74 of the unit housing 70. More specifically, the guide pins as an example of the slide part may protrude from the unit housing 70 toward one side in the height direction of the unit housing 70, and may be inserted into the front-side guide holes as the guide part formed in the upper-side divider 38U or the lower-side divider 38L. Moreover, the guide part is not limited to the guide holes, but guide rails, for example, may be used.

Next, description is given of an example of a method for mounting the rack mount unit 30 in the rack 12.

First, as illustrated in FIG. 2, the mount housing 32 having no electronic unit 60 housed therein is housed between the pair of mount frames 28 in the rack 12 from the mount opening 22 of the rack 12. Then, as illustrated in FIG. 3, the flange parts 42B of the mount brackets 42 are placed on predetermined positions on the flange parts 28B of the mount frames 28 in the front-rear direction of the rack 12. Next, the flange parts 42B of the mount brackets 42 are fixed to the flange parts 28B of the mount frames 28 with the bolts 48 and the nuts 49. Thus, the mount housing 32 is mounted in the rack 12.

Next, the multiple cooling fans 58 are mounted behind the mount housing 32 inside the rack 12. Moreover, unillustrated cables or the like are installed in the wiring spaces 50 before the flange parts 28B of the mount brackets 42. Note that the cooling fans 58 may be previously mounted in the rack 12.

Next, as illustrated in FIG. 4, the electronic unit 60 is housed between the lower-side divider 38L and the upper-side divider 38U (see FIG. 1) from the housing opening 44 in the mount housing 32. In this event, the opening mechanisms 100 for the intake movable ducts 80 and the opening mechanisms 110 for the exhaust movable ducts 90 are operated to change the intake movable ducts 80 and the exhaust movable ducts 90 from the housed state to the opened state.

Figure 12A:
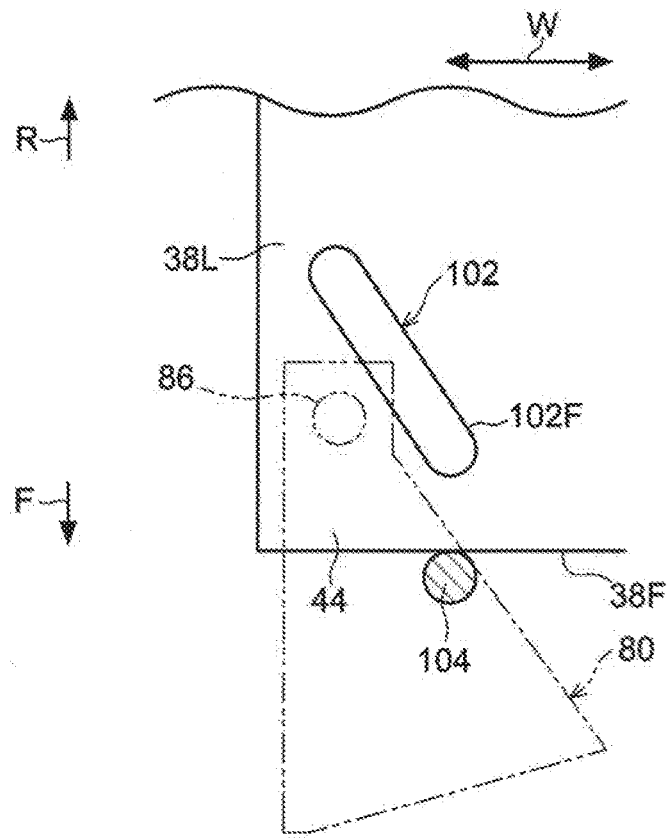
FIG. 12A is a plan view illustrating a guide pin and a front-side guide hole in the intake movable duct.
Figure 12B:
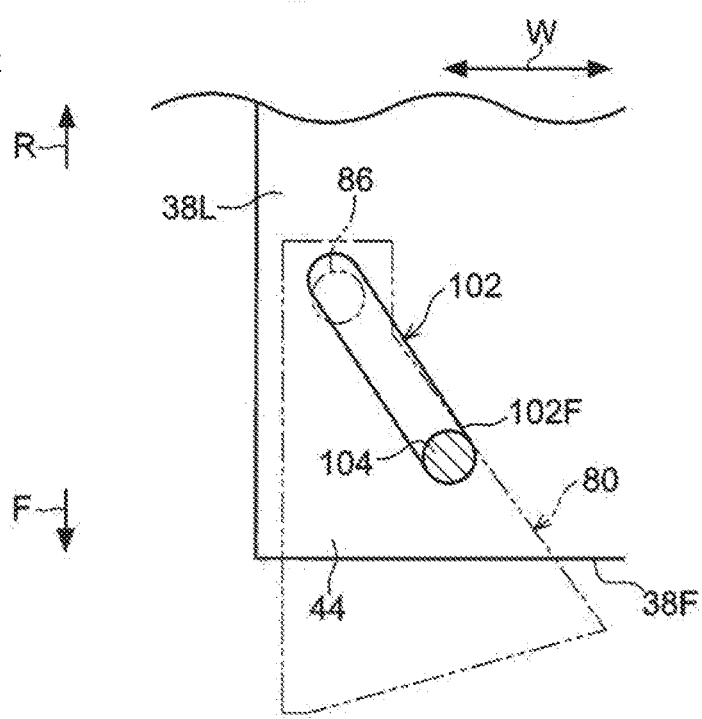
FIG. 12B is a plan view illustrating the guide pin and the front-side guide hole in the intake movable duct.

To be more specific, as illustrated in FIGS. 11B and 12A, the following occurs when the guide pin 104 in the intake movable duct 80 comes into contact with the end 38F on the housing opening 44 side of the lower-side divider 38L. More specifically, the guide pin 104 rises along the tilted surface 104A (arrow a in FIG. 11B) and runs on the lower-side divider 38L. In this event, as indicated by the chain double-dashed lines in FIG. 10, the lower wall part 80L of the intake movable duct 80 is elastically deformed upward (arrow b) relative to the vertical wall part 80S. In this state, as illustrated in FIGS. 11C and 12B, when the guide pin 104 reaches the end 102F on the housing opening 44 side of the front-side guide hole 102, the lower wall part 80L of the intake movable duct 80 is restored from the elastic deformation and moved downward (arrow c in FIG. 11C), and then the guide pin 104 is inserted into the end 102F of the front-side guide hole 102.

Figure 13A:
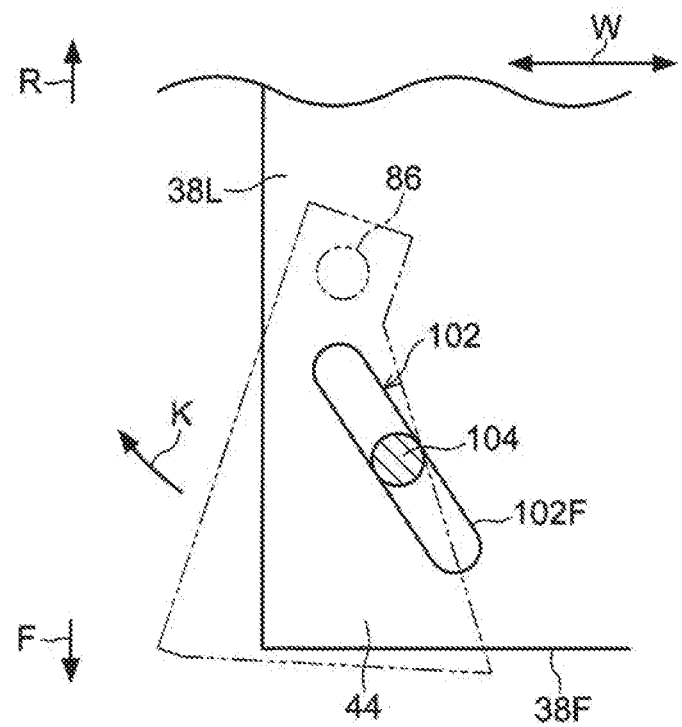
FIG. 13A is a plan view illustrating the guide pin and the front-side guide hole in the intake movable duct.
Figure 13B:
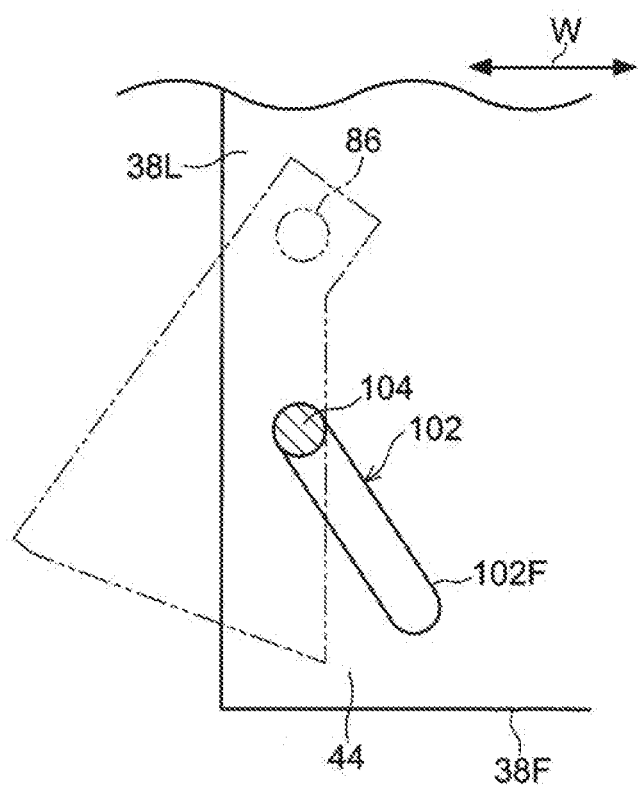
FIG. 13B is a plan view illustrating the guide pin and the front-side guide hole in the intake movable duct.

In this state, when the electronic unit 60 is further moved into the back-end side of the mount housing 32, the guide pin 104 is engaged with the peripheral part of the front-side guide hole 102 and slides along the front-side guide hole 102 as illustrated in FIGS. 13A and 13B. Thus, the intake movable duct 80 is rotated (arrow K in FIG. 13A) about the pair of rotary shafts 86, and is changed from the housed state to the opened state.

Figure 14A:
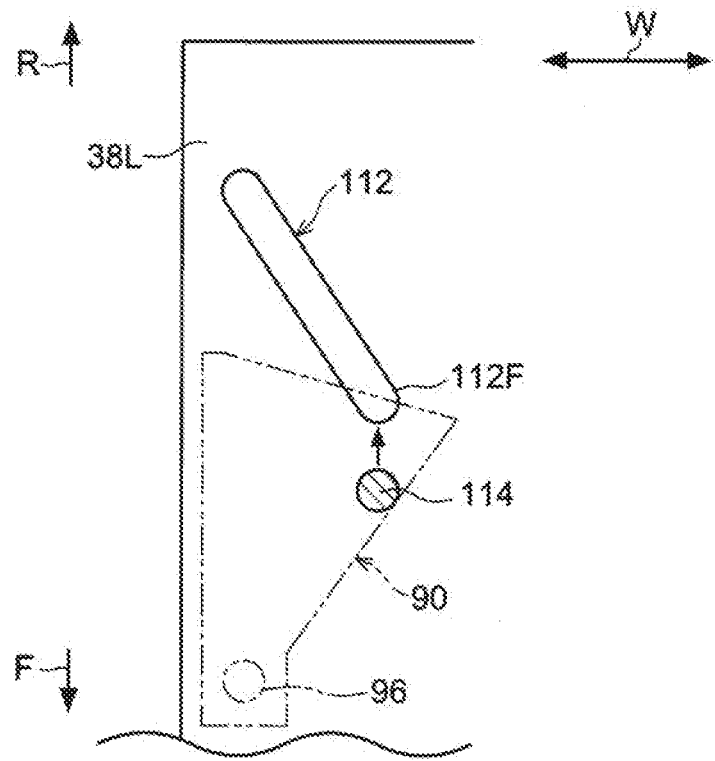
FIG. 14A is a plan view illustrating a guide pin and a rear-side guide hole in an exhaust movable duct.
Figure 14B:
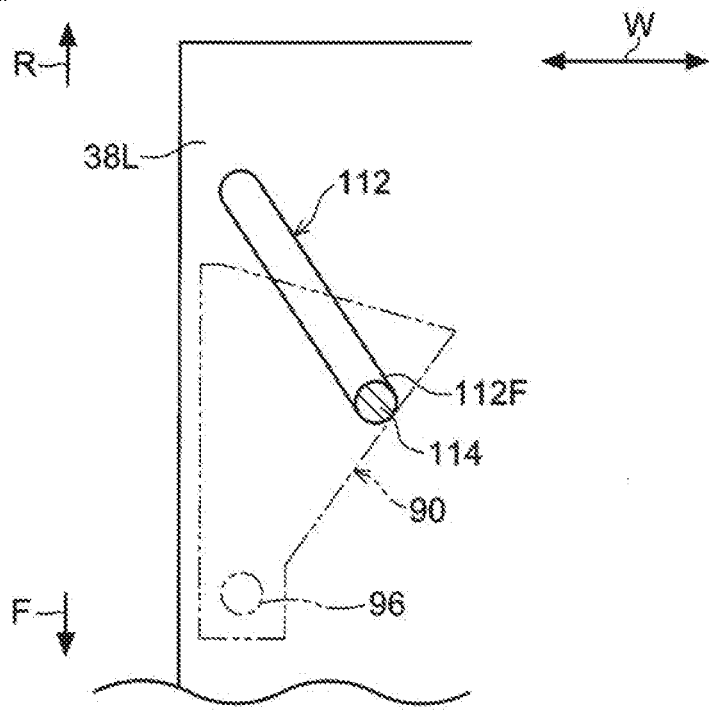
FIG. 14B is a plan view illustrating the guide pin and the rear-side guide hole in the exhaust movable duct.

As in the case of the intake movable duct 80, as illustrated in FIGS. 14A and 14B, when the guide pin 114 in the exhaust movable duct 90 reaches the end 112F on the housing opening 44 side of the rear-side guide hole 112, the guide pin 114 is inserted into the rear-side guide hole 112.

Figure 15A:
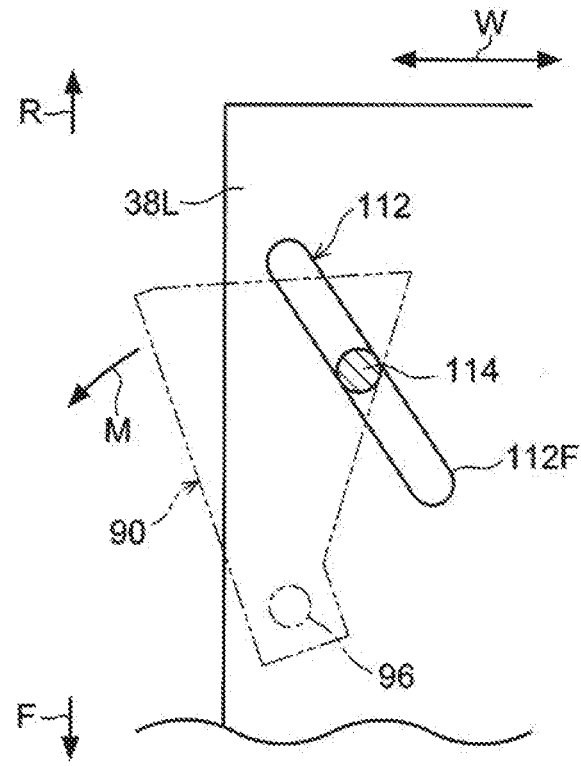
FIG. 15A is a plan view illustrating the guide pin and the rear-side guide hole in the exhaust movable duct.
Figure 15B:
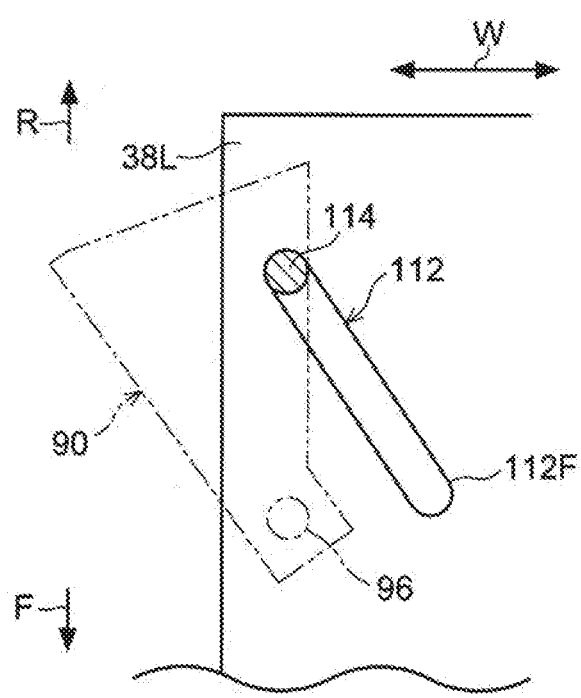
FIG. 15B is a plan view illustrating the guide pin and the rear-side guide hole in the exhaust movable duct.

In this state, when the electronic unit 60 is moved into the back-end side of the mount housing 32, the guide pin 114 is engaged with the peripheral part of the rear-side guide hole 112 and slides along the rear-side guide hole 112 as illustrated in FIGS. 15A and 15B. Thus, the exhaust movable duct 90 is rotated (arrow M in FIG. 15A) about the pair of rotary shafts 96, and is changed from the housed state to the opened state.

Next, multiple the electronic units 60 are housed in the mount housing 32 by following the same procedures as those described above. Note that a dummy electronic unit having no printed circuit board 62 and the like mounted therein may be housed in an empty space (empty slot) in the mount housing 32.

Here, in the opened state of the intake movable ducts 80, as illustrated in FIG. 4, the intake movable ducts 80 protrude to the outside of the mount housing 32 through the front-side openings 52F in the mount housing 32. Thus, the ventilation flues 82 communicating with the vent holes 78 in the unit housing 70 are formed outside the mount housing 32 and in front of the flange parts 42B of the mount brackets 42 and the wiring spaces 50.

Moreover, in the opened state of the exhaust movable ducts 90, the exhaust movable ducts 90 protrude to the outside of the mount housing 32 through the rear-side openings 52R in the mount housing 32. Thus, the ventilation flues 92 communicating with the vent holes 79 in the unit housing 70 are formed outside the mount housing 32 and behind the flange parts 28B of the mount frames 28.

Next, operations and effects of the first embodiment are described.

As illustrated in FIG. 4, according to this embodiment, when the multiple cooling fans 58 are operated, the cooling air V is introduced into the rack 12 from the mount opening 22 on the front face 12F side of the rack 12. The cooling air V introduced into the rack 12 is discharged to the outside of the mount housing 32 from the rear face 32R side of the mount housing 32. Then, the cooling air V discharged to the outside of the mount housing 32 is discharged to the outside of the rack 12 from the outlet 24 on the rear face 12R side of the rack 12. The cooling air V cools the printed circuit board 62 in the electronic unit 60 housed in the mount housing 32.

Here, the densification of the multiple electronic components 64 mounted on the printed circuit board 62 increases the amount of heat generated in the printed circuit board 62. When the multiple electronic components 64 are densely mounted on the printed circuit board 62, a poor flow of the cooling air V inside the unit housing 70 may reduce cooling efficiency of the printed circuit board 62.

Particularly, in this embodiment, the multiple cable connectors 68 are densely mounted as the electronic components on the front-end side of the printed circuit board 62. Moreover, an electronic component with a message alerting an operator, and the like are mounted on the front-end side of the printed circuit board 62. Thus, various electronic components are likely to be mounted in high density. Therefore, it is difficult to reserve a sufficient space for an inlet to take the cooling air V into the unit housing 70, on the front face 70F side of the unit housing 70.

Likewise, in this embodiment, the second connectors 69 are densely mounted on the rear end side of the printed circuit board 62. Moreover, the backboard 54 is disposed behind the unit housing 70. Thus, it is difficult to reserve a sufficient space for an outlet to discharge the cooling air V inside the unit housing 70 to the outside of the unit housing 70, on the rear face 70R side of the unit housing 70. Therefore, in this embodiment, the cooling efficiency of the printed circuit board 62 may be reduced.

As measures against the above problem, in this embodiment, a pair of intake movable ducts 80 and a pair of exhaust movable ducts 90 are provided in the electronic unit 60. When the electronic unit 60 is housed in the mount housing 32, the opening mechanisms 100 and 110 are operated as described above, and the pair of intake movable ducts 80 and the pair of exhaust movable ducts 90 are changed from the housed state to the opened state, respectively.

Thus, the pair of intake movable ducts 80 form the ventilation flues 82 outside the sidewall parts 40 on the front side of the mount housing 32. The ventilation flues 82 are communicating with the vent holes 78 on the front side of the mount housing 32. The cooling air V is introduced into the unit housing 70 through the ventilation flues 82.

Moreover, the pair of exhaust movable ducts 90 form the ventilation flues 92 outside the sidewall parts 40 on the rear side of the mount housing 32. The ventilation flues 92 are communicating with the vent holes 79 on the rear side of the mount housing 32. The cooling air V inside the unit housing 70 is discharged to the outside of the unit housing 70 through the ventilation flues 92. Therefore, ventilation efficiency inside the unit housing 70 is improved, thus suppressing reduction in the cooling efficiency of the printed circuit board 62 and the electronic components 64 mounted on the printed circuit board 62.

As described above, in this embodiment, the reduction in the cooling efficiency of the printed circuit board 62 and the electronic components 64 may be suppressed while densely mounting the multiple electronic components 64 on the printed circuit board 62.

Moreover, in the opened state of the intake movable ducts 80, the inlets 82A of the intake movable ducts 80 face the front side of the rack 12. This makes it easier for the cooling air V to be introduced into the ventilation flues 82 in the intake movable ducts 80 from the inlets 82A.

Furthermore, in the opened state of the exhaust movable ducts 90, the outlets 92A of the exhaust movable ducts 90 are arranged on the outside of the backboard 54 in the width direction. This makes it easier for the cooling air V inside the unit housing 70 to be discharged to the outside of the unit housing 70 from the outlets 92A of the exhaust movable ducts 90. Furthermore, the outlets 92A of the exhaust movable ducts 90 face the rear side. Moreover, the cooling fans 58 are disposed behind the outlets 92A of the exhaust movable ducts 90. This makes it much easier for the cooling air V inside the unit housing 70 to be discharged to the outside of the unit housing 70 from the outlets 92A of the exhaust movable ducts 90. Therefore, the reduction in the cooling efficiency of the printed circuit board 62 and the electronic components 64 is further suppressed.

Moreover, in this embodiment, when the electronic unit 60 is housed into the mount housing 32, the pair of intake movable ducts 80 and the pair of exhaust movable ducts 90 are changed from the housed state to the opened state. Therefore, the pair of exhaust movable ducts 90 are hindered from interfering with the mount brackets 42 when the electronic unit 60 is housed into the mount housing 32. More specifically, in this embodiment, the pair of intake movable ducts 80 and the pair of exhaust movable ducts 90 may be easily opened on the both sides of the mount brackets 42 in the front-rear direction.

Moreover, in the housed state of the pair of intake movable ducts 80 and the pair of exhaust movable ducts 90, the pair of intake movable ducts 80 and the pair of exhaust movable ducts 90 do not protrude on the outside of the mount housing 32 in the width direction. Therefore, it is made easier to reserve work spaces for fixing the flange parts 42B of the mount brackets 42 to the flange parts 28B of the mount frames 28 with the bolts 48 and the like, on the outside the mount housing 32 in the width direction. Moreover, it is also made easier to reserve work spaces for forming (arrangement, installation, and the like) cables and the like in the wiring spaces 50 on the outside of the mount housing 32 in the width direction.

Moreover, when the electronic unit 60 is housed into the mount housing 32, the pair of intake movable ducts 80 and the pair of exhaust movable ducts 90 are changed from the housed state to the opened state by the opening mechanisms 100 and 110. Therefore, for example, time and effort are saved for the operator to change the pair of intake movable ducts 80 and the pair of exhaust movable ducts 90 from the housed state to the opened state.

Second Embodiment

Next, a second embodiment is described. Note that, in the second embodiment, members and the like having the same configurations as those in the first embodiment are denoted by the same reference numerals, and description thereof is omitted.

Figure 16:
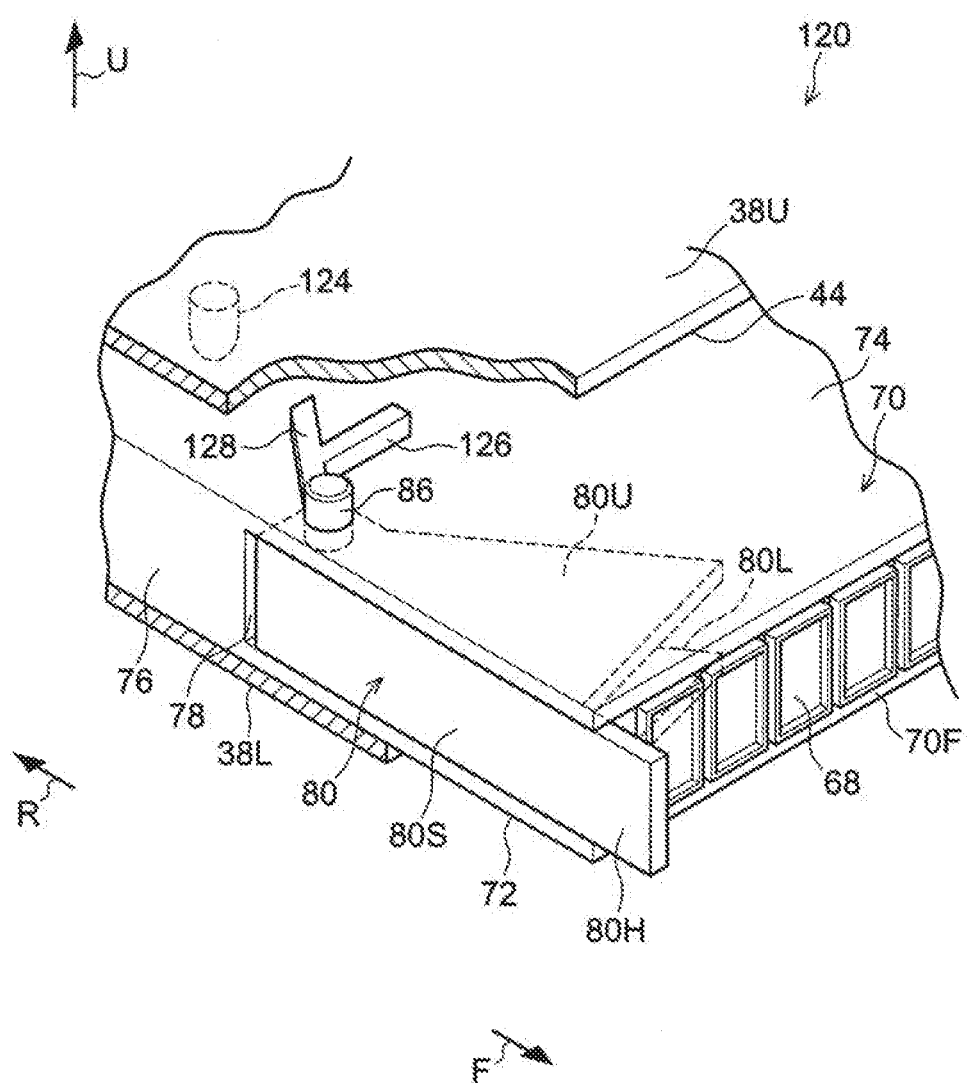
FIG. 16 is a perspective view illustrating an electronic unit according to a second embodiment.
Figure 17:
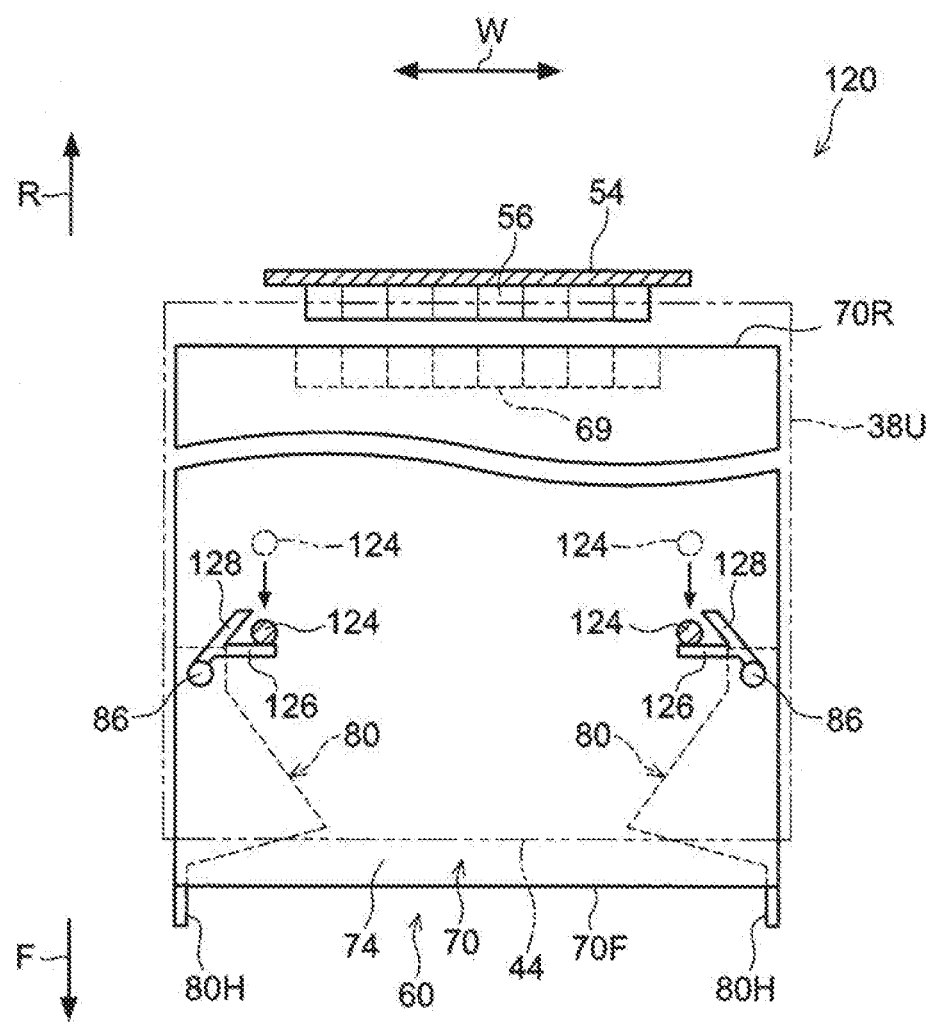
FIG. 17 is a plan view illustrating the electronic unit illustrated in FIG. 16.

As illustrated in FIGS. 16 and 17, a rack mount unit 120 according to the second embodiment, intake movable ducts 80 are manually changed from a housed state to an opened state. Moreover, the intake movable ducts 80 also have a function as connection levers (card levers) for connecting the second connectors 69 in the electronic unit 60 to the first connectors 56 in the backboard 54 using the principle of leverage.

To be more specific, a pair of hook pins 124 are provided on the upper-side divider 38U of the mount housing 32. The pair of hook pins 124 are formed into a cylindrical shape, and protrude toward the lower-side divider 38L from the lower surface on both sides in the width direction of the upper-side divider 38U. Note that the hook pins 124 are an example of a hook part.

Each of the intake movable ducts 80 includes a release arm 126 and a connection arm 128. The release arm 126 and the connection arm 128 are provided on the rotary shaft 86 of the intake movable duct 80, and are rotated integrally with the rotary shaft 86. Note that the release arm 126 is an example of a contact part, and the connection arm 128 is an example of a pressing part.

The release arm 126 extends to the center of the unit housing 70 in the width direction from the rotary shaft 86 in the housed state. The release arm 126 overlaps with the hook pin 124 as seen from the housing direction (front-rear direction) of the electronic unit 60 in the mount housing 32, and comes into contact with the hook pin 124 when the electronic unit 60 is housed into the mount housing 32.

On the other hand, the connection arm 128 extends to the back-end side of the unit housing 70 and to the center in the width direction from the rotary shaft 86 in the housed state. The connection arm 128 does not overlap with the hook pin 124 as seen from the housing direction of the electronic unit 60 in the mount housing 32.

The vertical wall part 80S of the intake movable duct 80 is provided with an operation part 80H extending closer to the front than the unit housing 70. The intake movable duct 80 is changed from the housed state to the opened state by the operator operating the operation part 80H.

Next, operations and effects of the second embodiment are described.

Figure 18:
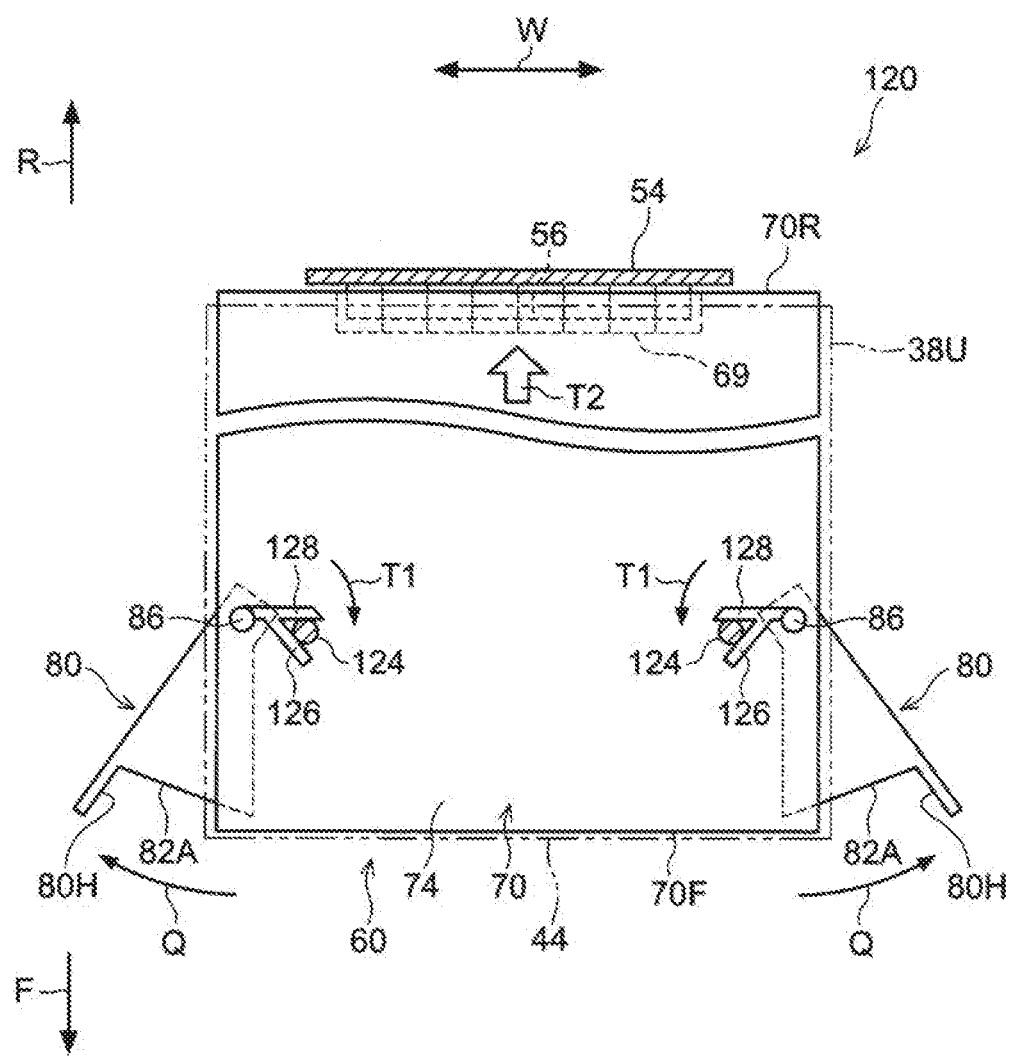
FIG. 18 is a plan view illustrating the electronic unit illustrated in FIG. 16.

The following occurs when the intake movable ducts 80 are changed from the housed state to the opened state in a state where the release arm 126 comes into contact with the hook pin 124 when the electronic unit 60 is housed into the mount housing 32, as illustrated in FIG. 17. More specifically, as illustrated in FIG. 18, the connection arm 128 is rotated (arrow T1) integrally with the rotary shaft 86 and presses the hook pin 124 toward the housing opening 44 of the mount housing 32.

Thus, the electronic unit 60 is moved (arrow T2) to the back-end side (rear side) of the mount housing 32 relative to the hook pin 124, and the second connectors 69 in the electronic unit 60 are connected to the first connectors 56 in the backboard 54. In this event, according to the principle of leverage using the rotary shaft 86 as the fulcrum, operation force Q of the operator to be inputted to the operation part 80H is amplified and transmitted to the hook pin 124. Therefore, the first connectors 56 and the second connectors 69 may be easily connected to each other.

Moreover, the following occurs when the intake movable ducts 80 are changed from the opened state to the housed state in the state where the first connectors 56 and the second connectors 69 are connected to each other. More specifically, the release arm 126 is rotated integrally with the rotary shaft 86, and presses the hook pin 124 to the back-end side of the mount housing 32. Thus, the electronic unit 60 is moved toward the housing opening 44 of the mount housing 32 with respect to the hook pin 124, and the connection between the first connectors 56 and the second connectors 69 is released. In this event, according to the principle of leverage using the rotary shaft 86 as the fulcrum, the operation force Q of the operator to be inputted to the operation part 80H is amplified and transmitted to the hook pin 124. Therefore, the connection between the first connectors 56 and the second connectors 69 may be easily released.

Figure 19:
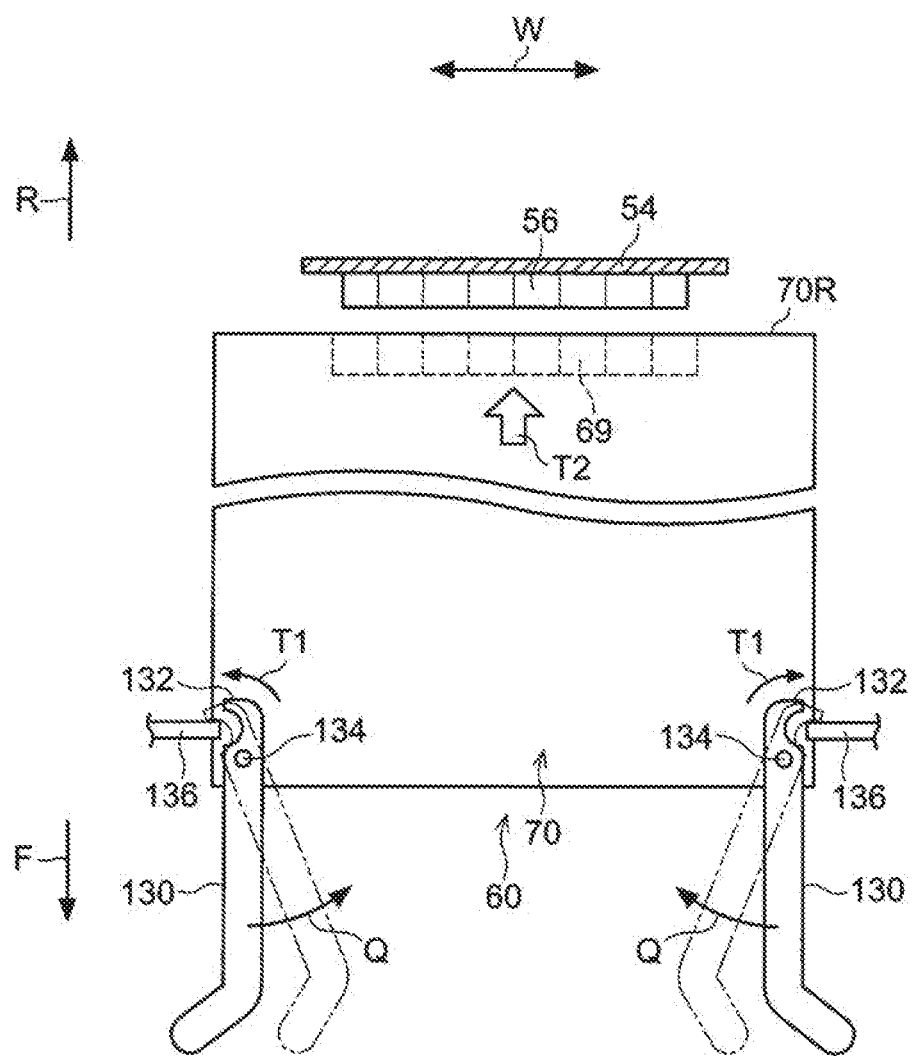
FIG. 19 is a plan view illustrating a conventional connection lever.

As described above, in this embodiment, the intake movable ducts 80 function as the connection levers for connecting the second connectors 69 in the electronic unit 60 to the first connectors 56 in the backboard 54. Therefore, the conventional connection levers 130 as illustrated in FIG. 19, for example, may be omitted.

Note that, as complementary information on the conventional connection levers 130, each of the conventional connection levers 130 has a hook 132 provided at its end. With a turn of the connection lever 130 around a rotation shaft 134 (arrow T1), the hook 132 catches an unillustrated hook part 136 provided on the mount housing 32 and presses the hook part 136 toward the front side (arrow F side). Thus, the electronic unit 60 is moved (arrow T2) to the back-end side (rear side) of the mount housing 32 with respect to the hook pin 124, and the second connectors 69 in the electronic unit 60 are connected to the first connectors 56 in the backboard 54.

Figure 20:
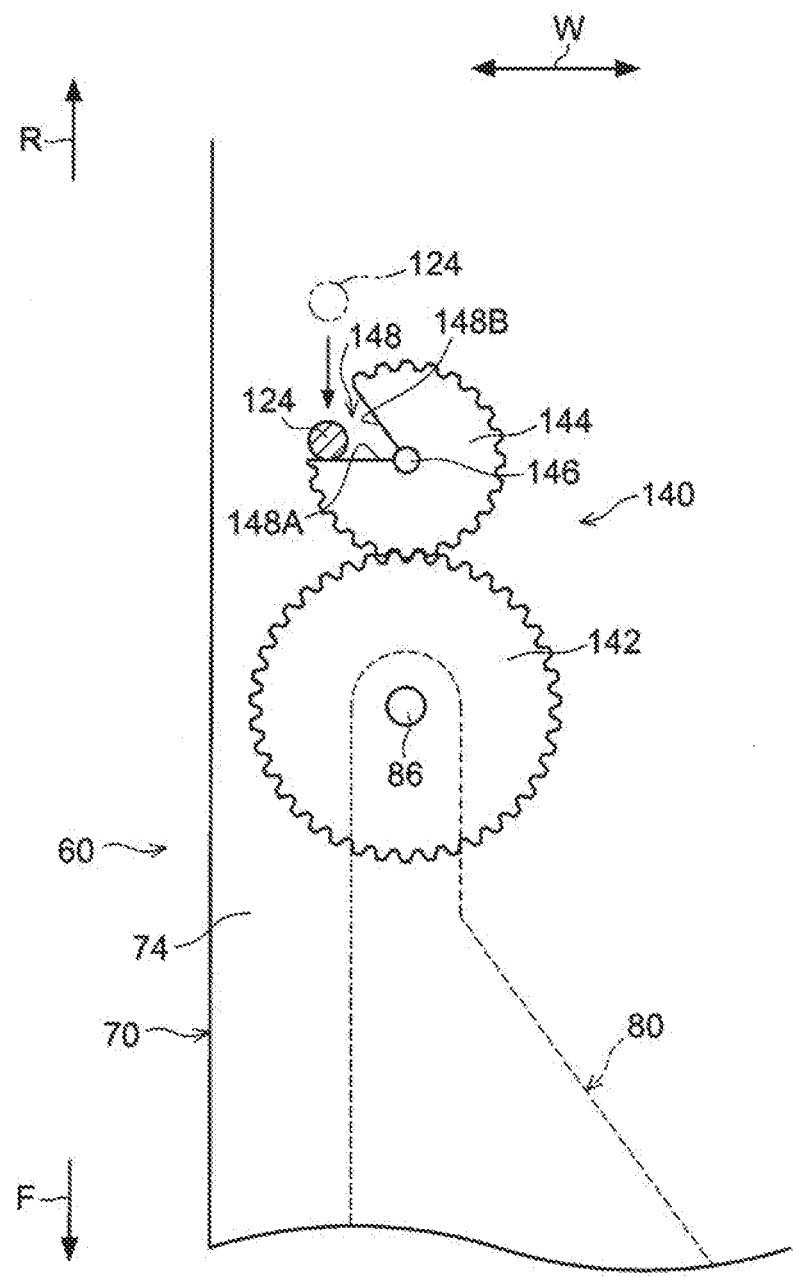
FIG. 20 is a plan view illustrating a gear mechanism according to the second embodiment.
Figure 21:
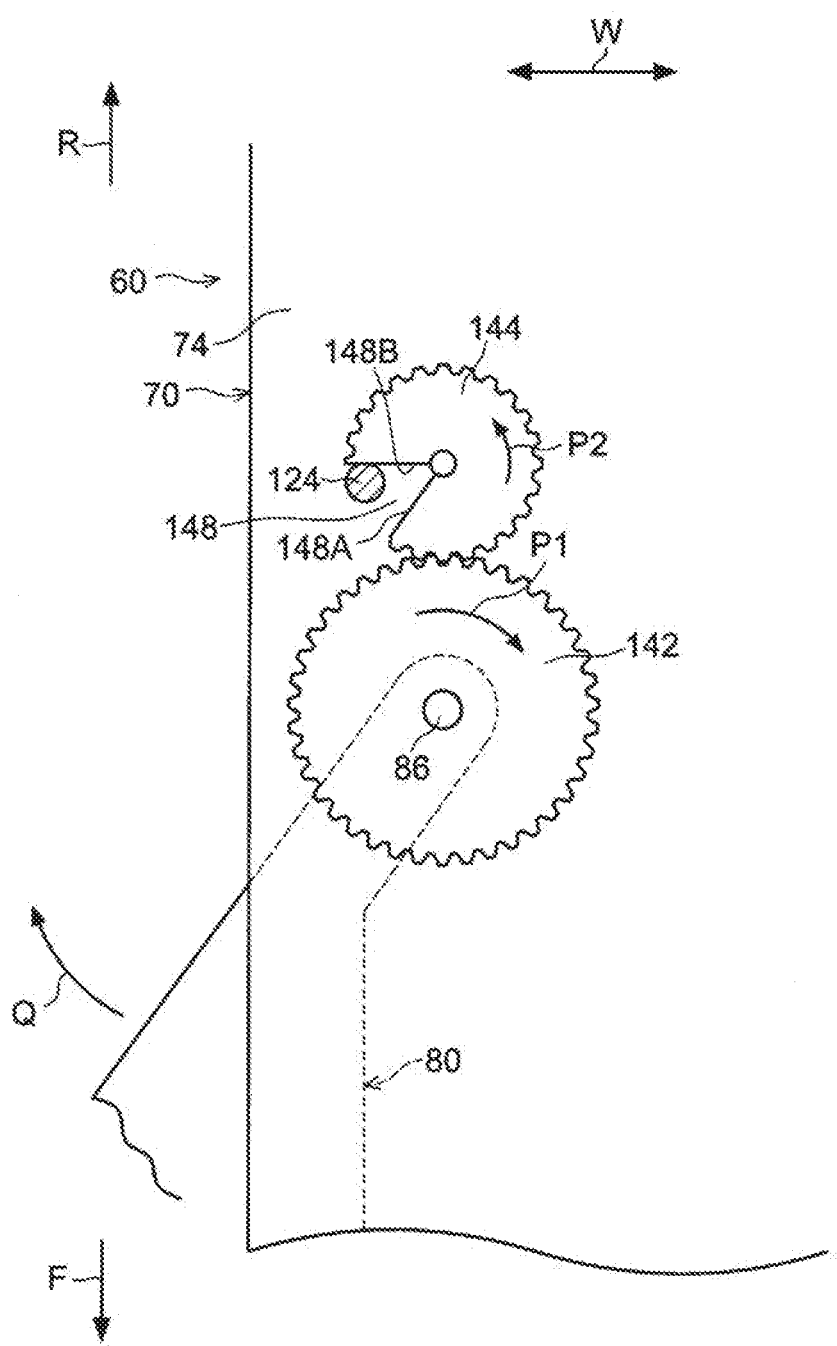
FIG. 21 is a plan view illustrating the gear mechanism according to the second embodiment.

Moreover, in this embodiment, the connection arm 128 and the release arm 126 are provided on the intake movable duct 80. However, this embodiment is not limited thereto. For example, as illustrated in FIGS. 20 and 21, a gear mechanism 140 may be provided in the intake movable duct 80.

To be more specific, the gear mechanism 140 includes a drive gear 142 and a driven gear 144. The drive gear 142 is provided coaxially with the rotary shaft 86 and rotated integrally with the rotary shaft 86. On the other hand, the driven gear 144 is rotated about a rotary shaft 146 provided in the unit housing 70. The driven gear 144 is engaged with the drive gear 142 and rotated in a direction opposite to the drive gear 142 with the rotation of the drive gear 142.

Moreover, the diameter of the driven gear 144 is set smaller than that of the drive gear 142. Furthermore, the number of teeth of the driven gear 144 is set smaller than that of the drive gear 142. Thus, according to a ratio (gear ratio) of the number of teeth of the driven gear 144 to the number of teeth of the drive gear 142, the rotation speed of the driven gear 144 is increased to be higher than the rotation speed of the drive gear 142. More specifically, the rotation amount of the driven gear 144 is set larger than that of the drive gear 142.

The driven gear 144 has a fan-shaped notch part 148 formed therein as seen from the axial direction of the rotary shaft 86. The notch part 148 includes a pair of a release edge 148A and a connection edge 148B along the radial direction of the driven gear 144. Note that the release edge 148A is an example of a contact part. Also, the connection edge 148B is an example of a pressing part.

Here, when the electronic unit 60 is housed in the mount housing 32 in the state where the intake movable ducts 80 are in the housed state, the hook pin 124 is inserted into the notch part 148 of the driven gear 144 and comes into contact with the release edge 148A of the notch part 148. The following occurs when the intake movable ducts 80 are changed from the housed state to the opened state by the operation force Q as illustrated in FIG. 21 in the above state.

More specifically, the drive gear 142 is rotated (arrow P1) integrally with the rotary shaft 86, and the driven gear 144 is rotated (arrow P2) in the opposite direction to the drive gear 142. With the rotation of the driven gear 144, the connection edge 148B of the notch part 148 presses the hook pin 124 toward the housing opening 44 (see FIG. 18) in the mount housing 32. Thus, the electronic unit 60 is moved to the back-end side (rear side) of the mount housing 32 relative the hook pin 124, and the second connectors 69 in the electronic unit 60 are connected to the first connectors 56 in the backboard 54.

Moreover, the following occurs when the intake movable ducts 80 are changed from the opened state to the housed state in the state where the first connectors 56 and the second connectors 69 are connected to each other. More specifically, the drive gear 142 is rotated integrally with the rotary shaft 86, and the driven gear 144 is rotated in the opposite direction to the drive gear 142. With the rotation of the driven gear 144, the release edge 148A of the notch part 148 presses the hook pin 124 to the back-end side of the mount housing 32. Thus, the electronic unit 60 is moved toward the housing opening 44 in the mount housing 32 relative to the hook pin 124, and the connection between the first connectors 56 and the second connectors 69 is released.

Here, when the rotation amount of the intake movable ducts 80 is small due to a failure in reserving a sufficient rotation space for the intake movable ducts 80 on the outside of the mount housing 32 in the width direction, for example, the following concern arises. Specifically, the movement amount (stroke) in the front-rear direction of the electronic unit 60 with the rotation of the intake movable ducts 80 is reduced, leading to a possibility that the second connectors 69 may not be connected to the first connectors 56.

On the other hand, in this embodiment, the rotation amount of the driven gear 144 is set larger than the rotation amount of the intake movable ducts 80 according to the gear ratio between the drive gear 142 and the driven gear 144. Therefore, since the movement amount in the front-rear direction of the electronic unit 60 with the rotation of the intake movable ducts 80 is increased, the first connectors 56 and the second connectors 69 may be connected to each other.

Note that the number of teeth of the driven gear 144 may be set larger than that of the drive gear 142. In this case, the operation force Q of the operator for connecting the first connectors 56 to the second connectors 69 is reduced.

Third Embodiment

Next, a third embodiment is described. Note that, in the third embodiment, members and the like having the same configurations as those in the first embodiment are denoted by the same reference numerals, and description thereof is omitted.

Figure 22:
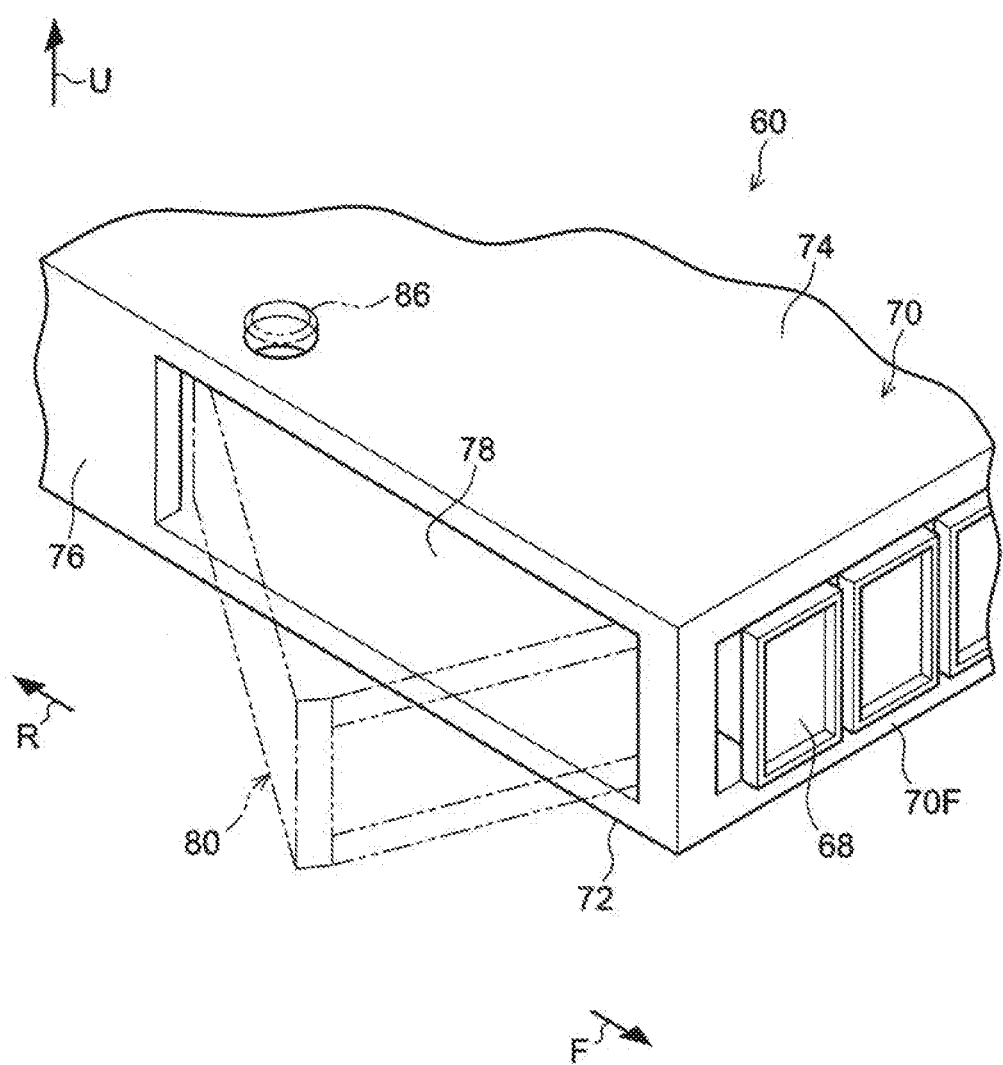
FIG. 22 is a perspective view illustrating the electronic unit according to the first embodiment.
Figure 23:
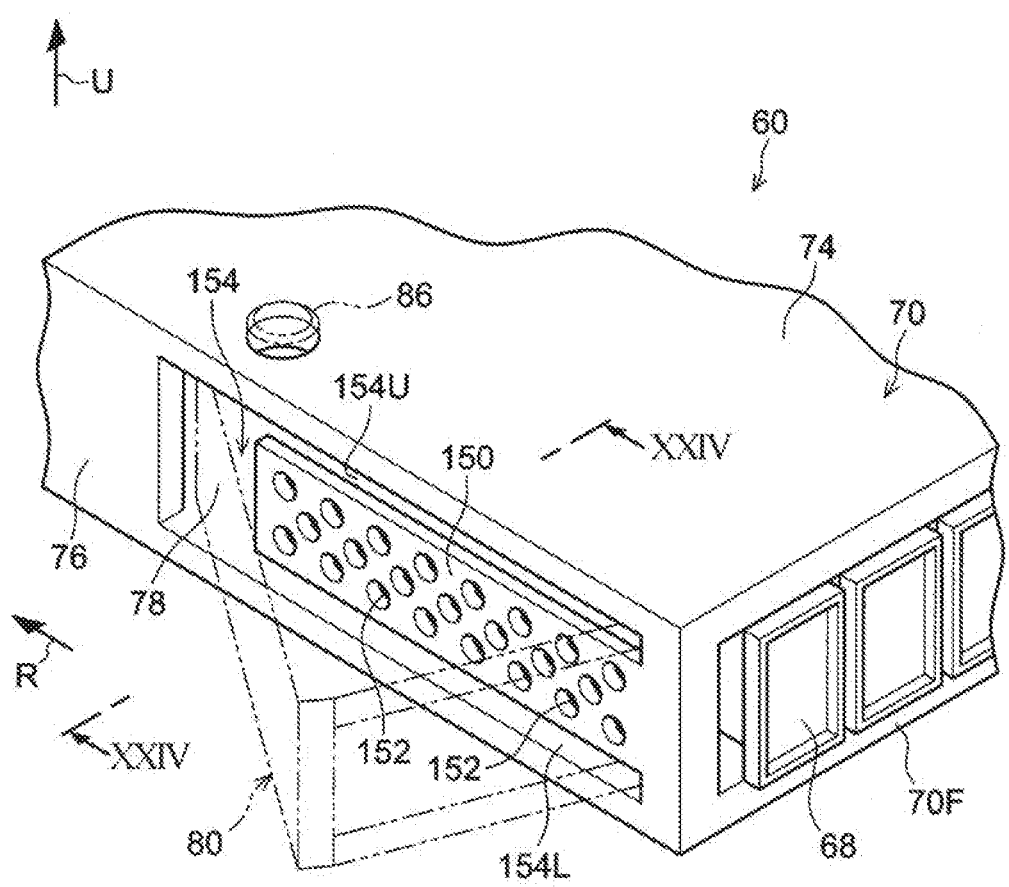
FIG. 23 is a perspective view illustrating an electronic unit according to a third embodiment.

In the first embodiment described above, as illustrated in FIG. 22, the vent hole 78 is formed in the sidewall part 76 on the front side of the unit housing 70. On the other hand, in the third embodiment, as illustrated in FIG. 23, the vent hole 78 is partially covered with an electromagnetic shield 150.

To be more specific, the sidewall part 76 of the unit housing 70 is formed using a conductive metal plate or the like. The sidewall part 76 has a U-shaped slit 154 formed therein with an opening on the front side. The part of the sidewall part 76 surrounded by the slit 154 serves as the electromagnetic shield 150. The electromagnetic shield 150 has multiple ventilation holes 152 formed therein.

Note that, hereinafter, the slit 154 along the upper end of the electromagnetic shield 150 is described as an upper slit 154U, and the slit 154 along the lower end of the electromagnetic shield 150 is described as a lower slit 154L.

Figure 24:
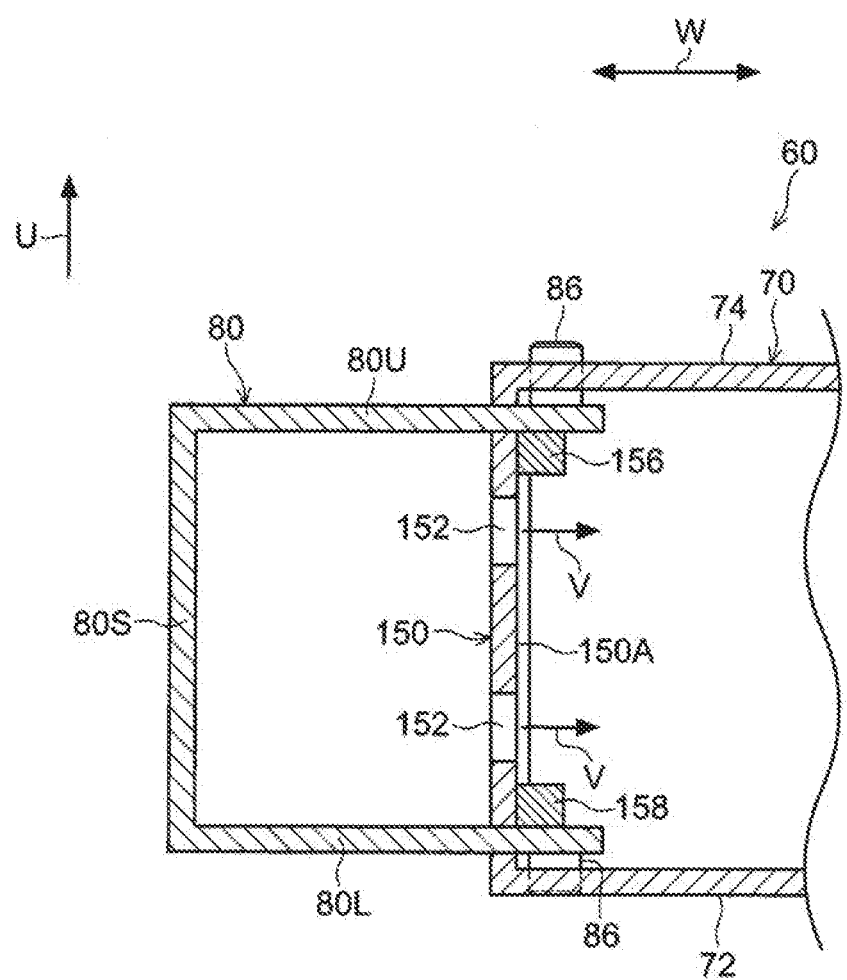
FIG. 24 is a cross-sectional view taken along the line XXIV-XXIV of FIG. 23.

As illustrated in FIG. 24, the vertical wall part 80S of the intake movable duct 80 is disposed outside the electromagnetic shield 150. Moreover, the upper wall part 80U of the intake movable duct 80 extends into the unit housing 70 through the upper slit 154U from the upper end of the vertical wall part 80S. Furthermore, the lower wall part 80L of the intake movable duct 80 extends into the unit housing 70 through the lower slit 154L from the lower end of the vertical wall part 80S.

Here, an upper conduction gasket 156 is provided on the lower surface of the upper wall part 80U disposed inside the unit housing 70. Likewise, a lower conduction gasket 158 is provided on the upper surface of the lower wall part 80L disposed inside the unit housing 70. The upper conduction gasket 156 and the lower conduction gasket 158 are conductive and come into contact with an inner surface 150A of the electromagnetic shield 150 in the opened state of the intake movable duct 80. Thus, the metal intake movable duct 80 is electrically connected to the electromagnetic shield 150.

Next, operations and effects of the third embodiment are described.

As illustrated in FIG. 23, in this embodiment, the vent hole 78 is partially covered with the electromagnetic shield 150. The electromagnetic shield 150 blocks electromagnetic waves passing through the vent hole 78. The electromagnetic shield 150 has the multiple ventilation holes 152 formed therein. The cooling air V (see FIG. 4) is introduced into the unit housing 70 through the ventilation holes 152.

Therefore, in this embodiment, the cooling air V may be introduced into the unit housing 70 while blocking the electromagnetic waves passing through the vent holes 78. Moreover, even when a fire occurs from the electronic components 64 in the unit housing 70, for example, the electromagnetic shield 150 suppresses the fire from leaking to the outside of the unit housing 70 through the vent holes 78.

Moreover, as illustrated in FIG. 24, when the intake movable duct 80 is in the opened state, the upper conduction gasket 156 on the upper wall part 80U and the lower conduction gasket 158 on the lower wall part 80L come into contact with the inner surface 150A of the electromagnetic shield 150. Thus, the intake movable duct 80 and the electromagnetic shield 150 are electrically connected to each other. As a result, electromagnetic waves passing through the upper slit 154U and the lower slit 154L are also blocked.

Note that the electromagnetic shield 150, the upper conduction gasket 156, and the lower conduction gasket 158 according to this embodiment may also be applied to the vent hole 79 and the exhaust movable duct 90 (see FIG. 7) on the rear side of the unit housing 70.

Fourth Embodiment

Next, a fourth embodiment is described. Note that, in the fourth embodiment, members and the like having the same configurations as those in the first embodiment are denoted by the same reference numerals, and description thereof is omitted.

Figure 25:
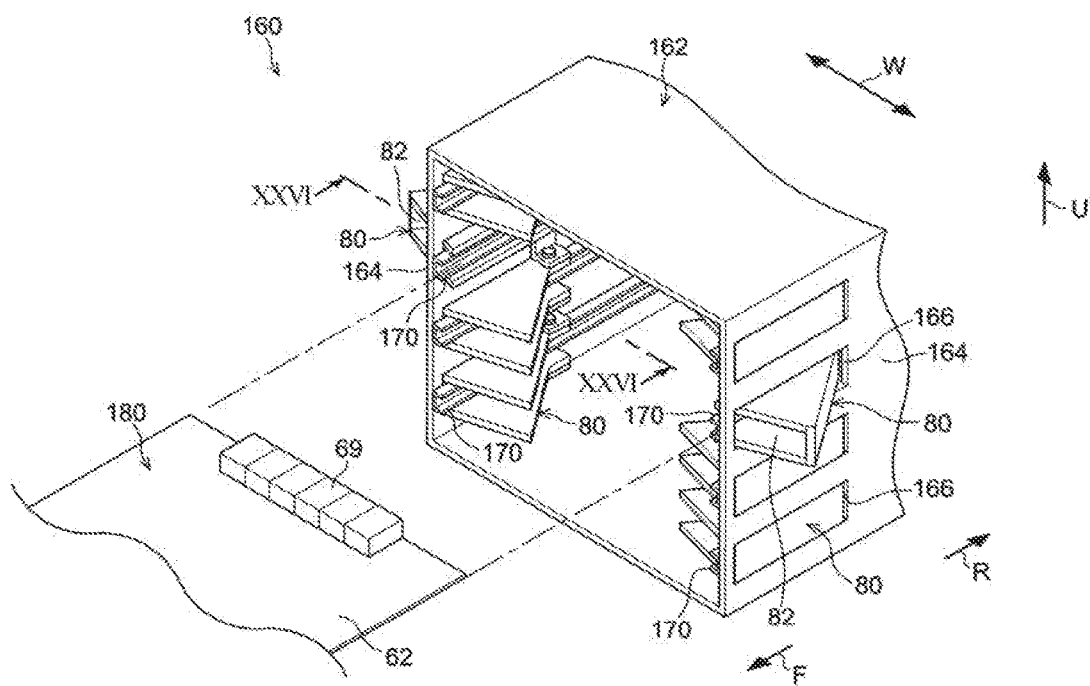
FIG. 25 is an exploded perspective view illustrating a rack mount apparatus according to a fourth embodiment.

As illustrated in FIG. 25, a rack mount unit 160 according to the fourth embodiment includes a mount housing 162 and multiple electronic unit 180 housed in the mount housing 162. Multiple front-side openings 166 are formed on the front side of a sidewall part 164 of the mount housing 162. The multiple front-side openings 166 are formed spaced apart from each other in the height direction of the mount housing 162. The intake movable duct 80 is disposed in each of the front-side openings 166. Note that the front-side opening 166 is an example of an opening.

Figure 26:
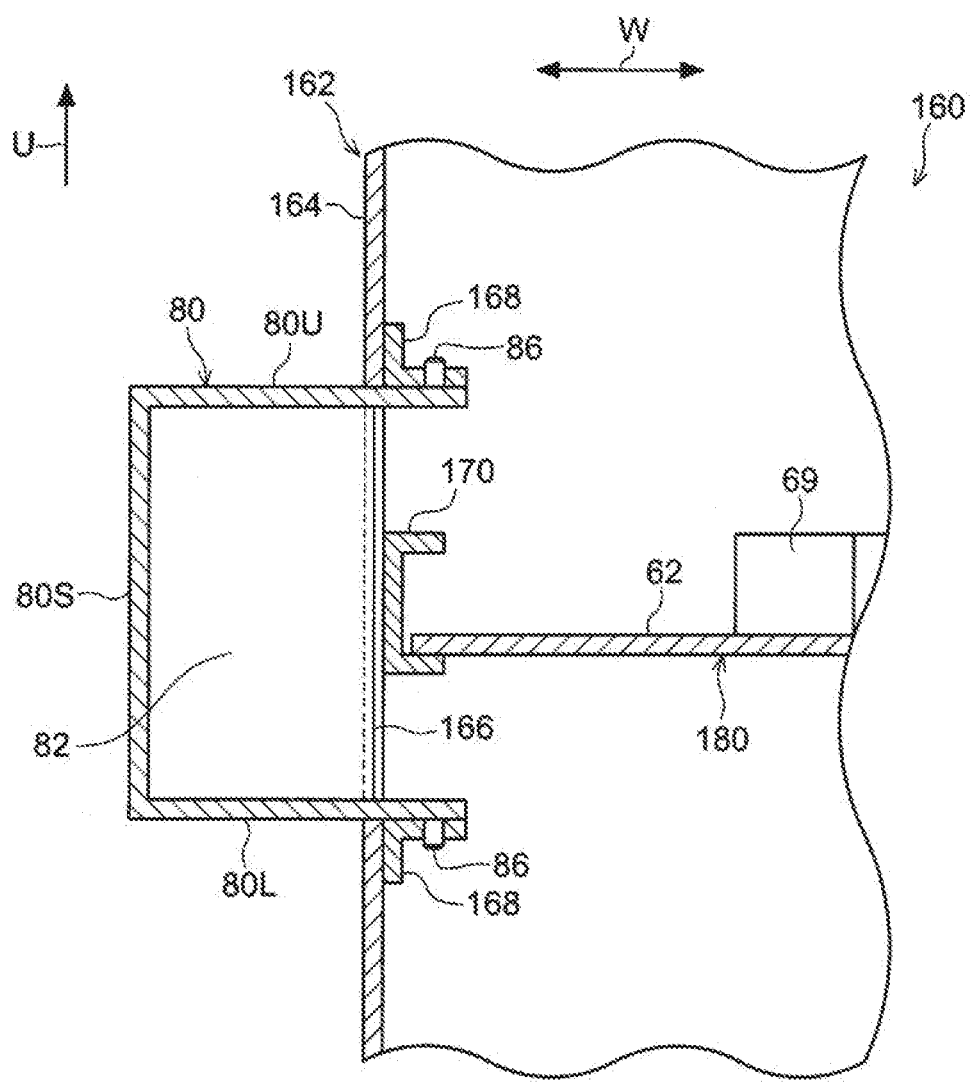
FIG. 26 is a cross-sectional view taken along the line XXVI-XXVI of FIG. 25.

As illustrated in FIG. 26, the intake movable duct 80 is rotatably connected to the inner surface of the sidewall part 164 through brackets 168. Moreover, a guide rail 170 extending in the front-rear direction of the mount housing 162 is provided on the inner surface of the sidewall part 164 of the mount housing 162. The guide rail 170 slidably supports a printed circuit board 62 in an electronic unit 180. Note that the electronic unit 180 in this embodiment includes no unit housing that houses the printed circuit board 62.

Next, operations and effects of the fourth embodiment are described.

For example, when the operator pulls out the intake movable duct 80 to the outside of the sidewall part 164 of the mount housing 162, the intake movable duct 80 is rotated about the pair of rotary shafts 86 and changed from the housed state to the opened state. Thus, the ventilation flue 82 communicating with the front-side opening 166 is formed outside the sidewall part 164 of the mount housing 162. Therefore, the same effects as those of the first embodiment described above may be achieved.

Note that, in this embodiment, the intake movable ducts 80 are provided in the mount housing 162. However, the exhaust movable ducts 90 (see FIG. 5) may be provided in the mount housing 162.

Modified Examples of First to Fourth Embodiments

Next, modified examples of the first to fourth embodiments are described. Note that various modified examples are described below based on the first embodiment as an example. However, such modified examples are also applicable as appropriate to the second to fourth embodiments.

In the first embodiment, the pair of intake movable ducts 80 and the pair of exhaust movable ducts 90 are provided in the electronic unit 60. However, the above embodiments are not limited thereto. At least one of the pair of intake movable ducts 80 and the pair of exhaust movable ducts 90 may be provided in the electronic unit 60.

The number of the intake movable ducts 80 and the number of the exhaust movable ducts 90 may be changed as appropriate. For example, one intake movable duct 80, rather than a pair of the intake movable ducts 80, may be provided in the electronic unit 60.

Moreover, in the first embodiment described above, the opening mechanisms 100 and 110 are provided in the rack mount unit 30. However, the opening mechanisms 100 and 110 may be omitted. When the opening mechanisms 100 and 110 are omitted, the intake movable ducts 80 and the exhaust movable ducts 90 are manually changed from the housed state to the opened state, for example.

Moreover, in the first embodiment described above, the intake movable duct 80 is rotated about the pair of rotary shafts 86 and thus changed from the housed state to the opened state. However, the first embodiment is not limited thereto. For example, the intake movable duct 80 may be slid in the width direction of the mount housing 32 by a slide mechanism and thus changed from the housed state to the opened state.

Moreover, in the first embodiment described above, the intake movable ducts 80 and the exhaust movable ducts 90 are made of metal. However, the intake movable ducts 80 and the exhaust movable ducts 90 may be made of resin or the like.

Moreover, in the first embodiment described above, the cooling air V flows from the front side toward the rear side of the rack 12. However, the cooling air V may flow from the rear side toward the front side of the rack 12. In this case, the intake movable ducts 80 in the first embodiment serve as the exhaust movable ducts, and the exhaust movable ducts 90 serve as the intake movable ducts.

Moreover, in the first embodiment described above, the cooling fans 58 are disposed behind the mount housing 32. However, the arrangement of the cooling fans 58 and the number thereof may be changed as appropriate. The cooling fans may be provided outside the rack 12, for example. Alternatively, the cooling fans may be provided in front of and behind the mount housing 32 (PUSH-PULL method).

Moreover, in the first embodiment described above, the wiring spaces 50 are provided before the mount frames 28 and the mount brackets 42. However, the arrangement of the wiring spaces 50 and the number thereof may be changed as appropriate.

Moreover, in the first embodiment described above, the first connectors 56 are provided in the backboard 54. However, the first connectors 56 may be provided in another member.

Moreover, in the first embodiment described above, the mount brackets 42 of the mount housing 32 are fixed to the mount frames 28 of the rack 12. However, the first embodiment is not limited thereto. A method for fixing the mount housing 32 to the rack 12 may be changed as appropriate.

Moreover, in the first embodiment described above, the shelf-type rack mount unit 30 configured to house the multiple electronic units 60 such as the plug-in units is used as the rack mount unit 30. However, the first embodiment is not limited thereto. The rack mount unit may be a box-type unit having multiple printed circuit boards and the like previously mounted therein, for example.

Although the embodiments of the technology disclosed herein are described above, the technology disclosed herein is not limited to the above embodiments. It is also a matter of course that the above embodiments and various modified examples may be used in appropriate combination, and that various embodiments may be implemented without departing from the scope of the technology disclosed herein.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
    a rack;
    a mount housing in which an electronic component is housed, and mounted in the rack from a front face side or rear face side of the rack; and
    a movable duct configured to have a housed state where the movable duct is retracted from an opening formed in a sidewall part of the mount housing and is housed in the mount housing and an opened state where the movable duct is moved to outside of the mount housing through the opening so as to form a ventilation flue located outside the mount housing and communicating with the opening, wherein
    the movable duct is arranged on one side in a front-rear direction of the sidewall part of the mount housing, and
    the ventilation flue includes an inlet/outlet arranged outside the mount housing and facing in one of front and rear directions of the mount housing in the opened state.

2. The electronic device according to claim 1, wherein the movable duct includes a rotary shaft extending in a height direction of the mount housing, and is changed between the housed state and the opened state with a rotation about the rotary shaft.

3. The electronic device according to claim 1, wherein
    the mount housing includes a fixing part which extends outward in a width direction of the mount housing from a middle part in the front-rear direction of the sidewall part, and
    the movable duct in the opened state is arranged at least on one side in the front-rear direction of the mount housing with respect to the fixing part.

4. The electronic device according to claim 3, wherein a plurality of the movable ducts are arranged on both sides in the front-rear direction of the mount housing across the fixing part and are arranged to face in opposite directions to each other.

5. The electronic device according to claim 3, wherein the rack includes a fixed part arranged outside the mount housing in the width direction, the fixing part being fixed to the fixed part while being engaged with the fixed part in the front-rear direction of the rack.

6. The electronic device according to claim 1, wherein
    a wiring space is provided outside the mount housing in the width direction inside the rack, and
    the movable duct in the opened state is arranged at least on one side in the front-rear direction of the rack with respect to the wiring space.

7. The electronic device according to claim 1, further comprising:
    a fan configured to generate cooling air flowing in the front-rear direction of the rack inside the rack.

8. The electronic device according to claim 7, wherein the fan is arranged facing the inlet/outlet of the movable duct in the opened state in the front-rear direction of the mount housing.

9. The electronic device according to claim 1, wherein the movable duct is arranged on each of both sides of the mount housing in the width direction.

10. The electronic device according to claim 7, further comprising:
    an electronic unit configured to include the electronic component and to be housed inside the mount housing from a housing opening formed on the front face side or rear face side of the mount housing,
    wherein the movable duct is arranged in the electronic unit.

11. The electronic device according to claim 10, wherein
    the mount housing includes a backboard which is arranged such that a thickness direction of the backboard is aligned with the front-rear direction of the mount housing, and to which the electronic unit is to be connected, and the movable duct in the opened state is positioned outside the backboard in a width direction of the mount housing.

12. The electronic device according to claim 10, wherein the mount housing includes a pair of an upper divider and a lower divider which face each other in a height direction of the mount housing, the electronic unit being housed between the upper divider and the lower divider, and at least one of the upper divider and the lower divider is provided with a guide part configured to move the movable duct in the housed state to the outside of the mount housing from the opening so as to change the movable duct from the housed state to the opened state when the electronic unit is housed into the mount housing.

13. The electronic device according to claim 12, wherein the guide part is arranged diagonally to extend outward in the width direction of the mount housing while extending from the housing opening to a back-end side of the mount housing being opposite from the housing opening, and the movable duct is provided with a slide part configured to be engaged with the guide part and to slide along the guide part when the electronic unit is housed into the mount housing.

14. The electronic device according to claim 12, wherein the mount housing includes
a first connector, and
a hook part configured to protrude toward the lower divider from the upper divider,
the electronic unit includes a second connector configured to be connected to the first connector in the front-rear direction of the mount housing, and
the movable duct includes
a contact part configured to come into contact with the hook part when the electronic unit is housed into the mount housing, and
a pressing part configured to catch the hook part, to press the hook part toward the housing opening, to move the electronic unit to a back-end side of the mount housing, and to connect the second connector to the first connector, when the movable duct with the contact part put in contact with the hook part is changed from the housed state to the opened state.

15. The electronic device according to claim 10, wherein the electronic unit includes
a printed circuit board which is arranged such that a thickness direction of the printed circuit board is aligned with a height direction of the mount housing, and on which the electronic component is to be mounted, and
a unit housing configured to house the printed circuit board, and the movable duct in the housed state is housed inside the unit housing, and the movable duct in the opened state protrudes to the outside of the mount housing through the opening from a vent hole formed in the sidewall part of the unit housing, and forms the ventilation flue located outside the mount housing and communicating with the vent hole.

16. The electronic device according to claim 15, wherein the sidewall part of the unit housing is provided with an electromagnetic shield covering a part of the vent hole and having a plurality of ventilation holes.

17. The electronic device according to claim 16, wherein the sidewall part of the unit housing is provided with an upper slit and a lower slit extending along an upper end and a lower end of the electromagnetic shield, respectively, and the movable duct is made of metal, and includes
a vertical wall part arranged outside the electromagnetic shield,
an upper wall part extending into the unit housing through the upper slit from an upper end of the vertical wall part,
a lower wall part extending into the unit housing through the lower slit from a lower end of the vertical wall part,
an upper conduction gasket being conductive, provided on the upper wall part inside the unit housing, and configured to come into contact with an inner surface of the electromagnetic shield in the opened state, and
a lower conduction gasket being conductive, provided on the lower wall part inside the unit housing, and configured to come into contact with the inner surface of the electromagnetic shield in the opened state.

18. The electronic device according to claim 1, wherein the movable duct is arranged in the mount housing.

19. A rack mount apparatus comprising:
a mount housing in which an electronic component is housed, and mounted in a rack from a front face side or rear face side of the rack; and
a movable duct configured to have a housed state where the movable duct is retracted from an opening formed in a sidewall part of the mount housing and is housed in the mount housing and an opened state where the movable duct is moved to outside of the mount housing through the opening so as form a ventilation flue located outside the mount housing and communicating with the opening, wherein
the movable duct is arranged on one side in a front-rear direction of the sidewall part of the mount housing, and
the ventilation flue includes an inlet/outlet arranged outside the mount housing and facing in one of front and rear directions of the mount housing in the opened state.

* * * * *